United States Patent [19]
Ichikawa

[11] Patent Number: 6,057,557
[45] Date of Patent: May 2, 2000

[54] SEMICONDUCTOR SUBSTRATE SEMICONDUCTOR DEVICE AND LIQUID CRYSTAL DISPLAY DEVICE

[75] Inventor: Takeshi Ichikawa, Hachioji, Japan

[73] Assignee: Canon Kabushiki Kaisha, Tokyo, Japan

[21] Appl. No.: 09/349,076

[22] Filed: Jul. 8, 1999

Related U.S. Application Data

[62] Division of application No. 08/922,644, Sep. 3, 1997, which is a continuation of application No. 08/455,845, May 31, 1995, abandoned, which is a continuation-in-part of application No. 08/160,227, Dec. 2, 1993, abandoned.

[30] Foreign Application Priority Data

Dec. 7, 1992 [JP] Japan .................................... 4-326902

[51] Int. Cl.[7] .................................................. H01L 29/04
[52] U.S. Cl. .................. 257/59; 257/62; 257/50; 257/51; 257/66; 257/72; 257/49
[58] Field of Search .................. 257/49–51, 59, 257/66, 62, 72

[56] References Cited

U.S. PATENT DOCUMENTS

| | | | |
|---|---|---|---|
| 4,353,788 | 10/1982 | Jeffrey et al. | 204/192.26 |
| 4,365,013 | 12/1982 | Ishioka et al. | 204/192.26 X |
| 4,412,900 | 11/1983 | Tanaka et al. | 204/192.26 |
| 4,533,450 | 8/1985 | Moustakas | 204/192.26 |
| 4,560,576 | 12/1985 | Lewis et al. | 204/192.26 X |
| 4,824,546 | 4/1989 | Ohmi | 204/298.08 |

FOREIGN PATENT DOCUMENTS 0458991  12/1991  European Pat. Off. .

OTHER PUBLICATIONS

Feng, G., et al., "Silicon Epitaxy at 230° C. by Reactive DC Magnetron Sputtering and its in Situ Ellipsometry Monitoring", Appl. Phys. Ltrs., 59, 330–332 (1991).

*Primary Examiner*—Fetsum Abraham
*Attorney, Agent, or Firm*—Fitzpatrick, Cella, Harper & Scinto

[57] ABSTRACT

A method of forming an Si film by a bias sputtering process comprises the steps of generating plasma between a target electrode holding a target material provided in a vacuum container and a substrate electrode holding a deposited film forming substrate, provided opposingly to the target electrode, by the use of a high-frequency energy to cause the target material to undergo sputtering, and applying a bias voltage to at least one of the target electrode and the substrate electrode to form an Si film comprised of atoms deposited by sputtering on the substrate, wherein;

a mixed-gas environment comprising a mixture of an inert gas and a hydrogen gas is formed in the vacuum container, and the target material is subjected to sputtering while controlling $H_2O$ gas, $CO$ gas and $CO_2$ gas in the mixed-gas environment to have a partial pressure of $1.0 \times 10^{-8}$ Torr or less each, to form an epitaxial film on the substrate while maintaining a substrate temperature in the range of from 400° C. to 700° C.

A semiconductor substrate comprises an Si layer having a carbon content, a hydrogen content and a rare gas (X) content of $C \leq 1 \times 10^{18}$ cm$^{-3}$, $1 \times 10^{15}$ cm$^{-3} \leq H \leq 1 \times 10^{20}$ cm$^{-3}$ and $1 \times 10^{16}$ cm$^{-3} \leq X$, respectively, and having a difference of 15 nm or less between a maximum value and a minimum value of surface roughness.

12 Claims, 16 Drawing Sheets

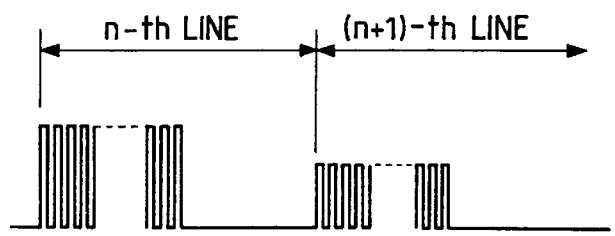
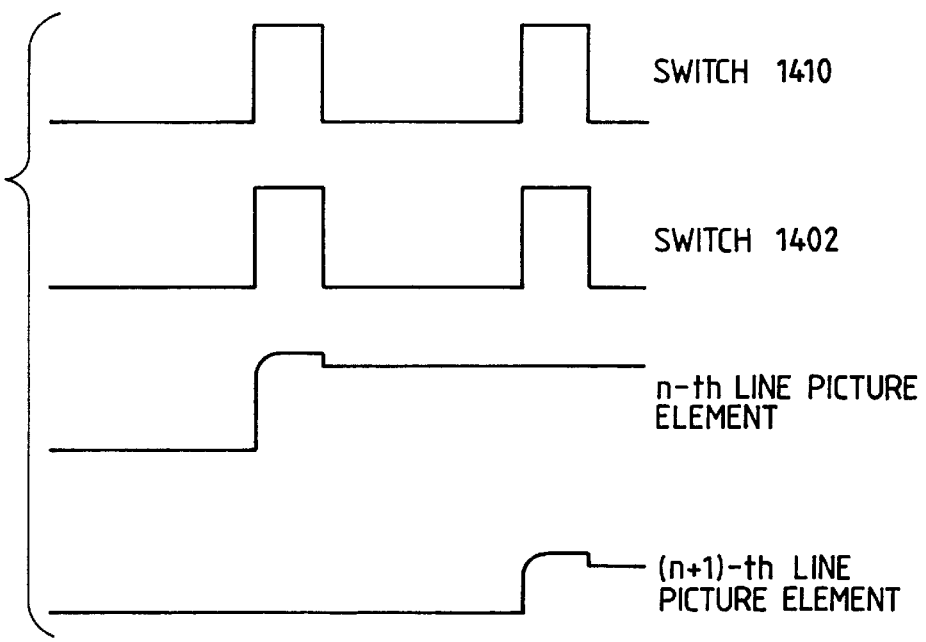

SEMICONDUCTOR SUBSTRATE SEMICONDUCTOR DEVICE AND LIQUID CRYSTAL DISPLAY DEVICE

This application is a division of application Ser. No. 08/922,644 filed Sep. 3, 1997, allowed, which is a continuation of application Ser. No. 08/455,845 filed May 31, 1995, now abandoned, which is a continuation-in-part of application Ser. No. 08/160,227 filed Dec. 2, 1993, now abandoned.

This is a continuation-in-part application of U.S. patent application Ser. No. 08/160,227 filed Dec. 2, 1993, abandoned.

BACKGROUND OF THE INVENTION

1. Field of the Invention

This invention relates to a method for producing a semiconductor substrate that can be applied in semiconductor devices or liquid-crystal display devices, and more particularly relates to a method for depositing Si film by sputtering. It also relates to a semiconductor substrate, and a semiconductor device or liquid-crystal display device having applied it.

2. Related Background Art

Semiconductor devices used in integrated circuits are commonly comprised of a thin-film multi-layered product formed by depositing a number of thin films layer by layer, and the quality of each thin film and the state of interfaces between thin films have a great influence on the performance of devices. Hence, high-level thin-film forming and multi-layer forming techniques are indispensable for providing high-performance semiconductor devices. In particular, what is called the epitaxial growth technique, which forms an additional high-quality crystal on a crystal face, is a thin-film forming technique indispensable for existing semiconductor techniques, and much research and development is being done on these techniques greatly since they influencing device performance. A thin film obtained by epitaxial growth is called an epitaxial film.

In conventional epitaxial growth techniques, CVD processes have been prevalent. However, film formation by CVD is, in general, carried out by a high-temperature process. For example, a film formation process for a silicon film (Si film) is carried out at a high temperature of 1,000° C. or above. This has brought about problems such as limitations on processes which can be used and a high production cost, ascribable to the high temperature. Moreover, it has now become difficult to meet demand for making dopant profiles shallower or sharper, which is a recent demand attributable to devices having been more highly integrated and having been made to have a higher performance.

Accordingly, as processes that can meet such demands, low-temperature epitaxial growth processes have been recently reported, including MBE (molecular beam epitaxy; A. Ishikawa and Y. Shiraishi, J. Electrochem. Soc., 133, 666, 1986), as well as FOCVD that carries out film formation by mixing a gaseous material and a halogen type oxidizing agent to cause chemical reaction so that a precursor serving as a feeding source of a film forming material is formed (U.S. Pat. No. 4,800,173), HRCVD that carries out film formation by separately introducing into a film forming space, gaseous materials activated in different activation spaces (U.S. Pat. No. 4,835,005), PIVD (partly ionized vapor deposition) that utilizes an ion beam process (T. Itoh, T. Nakamura, M. Muromachi and T. Sugiyama, Jpn. J. Appl. Phys. 16553, 1977), IBE (ion beam epitaxy; P. C. Zalm and J. Beckers, Appl. Phys. Lett. 41, 167, 1982), and ICBD (ion cluster beam deposition; I. Yamada, F. W. Saris, T. Takagi, K. Matsubara, H. Takaoka and S. Ishiyama, Jpn. J. Appl. Phys. 19, L181, 1980).

However, MBE requires a 800° C. or higher temperature process to form a high-quality epitaxial thin film and high-density doping is difficult. FOCVD and HRCVD, which utilize chemical reactions, have the problem that by-products may be formed and be incorporated as impurities into films. In what is called the ion beam process such as IBE or ICBD, the ions used have so much energy that substrates may be damaged, and no high-quality thin films usable in semiconductor devices have been obtained under exisiting circumstances.

The present inventors have reported Si epitaxial growth carried out by RF-DC combined bias sputtering, employing a method in which the surface layer is activated while controlling any damage on the substrate by precise control of ion energy (T. Ohmi, T. Ichikawa, et al., J. Appl. Phys. Vol.66, p.4756, 1989).

Hitherto, sputtering has not been considered utilizable to form epitaxial films because of difficulty in the controlling the damage of .substrates due to ion energy. It, however, has many other advantages, i.e.;

(1) it can readily form a large-area film;
(2) it can achieve a relatively simple device construction;
(3) it can match usual semiconductor processes; and
(4) it allows easy control of reaction systems.

The foregoing RF-DC combined bias sputtering can keep the advantages of sputtering in the epitaxial film forming techniques.

The RF-DC combined bias sputtering having such advantages, however, the following problems.

(1) When processing gas, argon atoms are incorporated into an epitaxial film in a concentration of $8 \times 10^{18}$ cm$^{-3}$ or more, the resulting film may have poor quality, and the quality may become extremely poor in a device fabrication process carried out at temperatures higher than film formation temperatures.

(2) The carbon can not be completely prevented from being included in films, and the same problem as in paragraph (1) may arise when carbon is included in a concentration of $1 \times 10^{18}$ cm$^{-3}$ or more.

(3) The process has a poor step coverage.

(4) An epitaxial film formed on the (111) crystal face of an Si substrate or a heteroepitaxial film such as an SiGe film formed on an Si substrate may have defects therein chiefly caused by many film deposition defects, to make the state of their interface unsatisfactory.

Thus, according to such epitaxial growth, it is very difficult to grow a monocrystal on an amorphous substrate or to grow a crystal having a lattice constant and a coefficient of thermal expansion that are different from those of the substrate. This has imposed restrictions on substrate materials usable and the types of films grown. Meanwhile, in research and development in recent years, development is energetically being made on three-dimensional integrated circuits that aim at higher integration and higher multifunction by forming semiconductor devices on a substrate layer by layer, and also on solar cells, switching transistors of liquid-crystal picture elements comprised of devices arranged in array arrays, etc., which are formed by depositing semiconductor materials on inexpensive glass substrates. Accordingly, it has become important to provide techniques by which high-quality semiconductor thin-film layers can be formed on an amorphous substrate having a structure that is common to these devices. In recent years, TFT thin-film forming techniques for achieving such a structure are remarkably improved. For example, ion implantation is carried out on a polycrystalline semiconductor thin film or amorphous semiconductor thin film on an amorphous substrate to make the film completely amorphous, followed by heat treatment to obtain a polycrystalline semiconductor thin film having a grain diameter as large as several pm (T. Noguchi et al., J. Electrochem. Soc. Vol. 134, No. 7, p.1771, 1987), or an amorphous semiconductor thin film deposited on an amorphous substrate by sputtering is exposed to laser light to obtain a polycrystalline semiconductor thin film having a grain diameter of about 400 Å (1989 Spring Season Applied Physics Society, 3P-ZH-15, 16). In both examples, MOS devices having fairly good electrical characteristics and showing a high mobility are fabricated.

Such an ion implantation method and a laser melting method, however, both essentially require a high-temperature process, and hence they not only are difficult to apply to three-dimensional integrated circuits, but also hinder to the large-area uniform thin-film formation, low-temperature process and simple process that are recently required for the purpose of adaptation to large-area substrates and cost reduction. Accordingly, it is sought to provide a high-quality thin-film forming technique by which high-quality devices can be formed on amorphous substrates by a simple low-temperature process that employs neither ion implantation nor laser melting. Meanwhile, sputtering and glow discharge, are processes for forming semiconductor thin films on low-temperature large-area amorphous substrates without use of the ion implantation or laser melting. Under existing circumstances, however, in view of electrical characteristics such as mobility, no satisfactory device characteristics can be obtained in the semiconductor thin films deposited by these processes, compared with the above processes.

SUMMARY OF THE INVENTION

The present inventors made extensive studies on the cause of the above problems to have reached the following findings.

(1) Argon atoms deposit on a substrate at a large coefficient when the substrate has a low temperature of about 300° C.

(2) The energy possessed by atoms such as Si that undergo epitaxial growth is so small that their surface migration may become insufficient.

(3) Carbon atoms are in the state they tend to be attached to the activated substrate surface.

The present invention was made from such findings.

An object of the present invention is to improve a method for forming a Si-deposited film, carried out by the above RF-DC combined bias sputtering, and provide a method for forming an Si-deposited film, that can achieve a good step coverage, may cause less film deposition defects to give a good interfacial state.

Another object of the present invention is to provide a method for forming an Si-deposited film, that can provide high-quality crystalline thin films having a small content of argon atoms, carbon atoms and so forth that may impair the quality of thin films, contained in processing gas.

The present invention provides a method for forming an Si-deposited film by a bias sputtering process comprising the steps of:

generating plasma between a target electrode holding a target material provided in a vacuum container and a substrate electrode holding a substrate for forming thereon the Si-deposited film, provided opposingly to the target electrode, by the use of a high-frequency energy to cause the target material to undergo sputtering; and applying a bias voltage to at least one of the target electrode and the substrate electrode to form the Si-deposited film, comprised of atoms deposited by sputtering on the substrate, wherein;

a mixed-gas environment comprising a mixture of an inert gas and a hydrogen gas which is in a content of above 10% to below 50% of the inert gas is formed in the vacuum container, and the target material is subjected to sputtering while reducing $H_2O$ gas, CO gas and $CO_2$ gas in the mixed-gas environment to have a partial pressure of $1.0 \times 10^{-8}$ Torr or less each, to form the Si-film on the substrate while maintaining a substrate temperature in the range of from 400° C. to 700° C.

In the present invention, $H_2$ gas/(Ar+$H_2$) gas ratio is preferably more than 10% to less than 50%, and more preferably more than 20% to less than 30%.

The present invention also embraces a semiconductor substrate, and a semiconductor device and a liquid-crystal display device that have applied it. More specifically, the semiconductor substrate of the present invention comprises a Si layer having a carbon content, a hydrogen content and a rare gas content of $C \leq 1 \times 10^{18}$ cm$^{-3}$, $1 \times 10^{15}$ cm$^{-3} \leq H \leq 1 \times 10^{20}$ cm$^{-3}$ and $1 \times 10^{16}$ cm$^{-3} \leq$ rare gas, respectively, and having a difference of 15 nm or less between a maximum value and a minimum value of surface roughness. The semiconductor device of the present invention comprises a Si semiconductor layer having a carbon content, a hydrogen content and a rare gas content of $C \leq 1 \times 10^{18}$ cm$^{-3}$, $1 \times 10^{15}$ cm$^{-3} \leq H \leq 1 \times 10^{20}$ cm$^{-3}$ and $1 \times 10^{16}$ cm$^{-3} \leq$ rare gas, respectively, and having a difference of 15 nm or less between a maximum value and a minimum value of surface roughness. The liquid-crystal display device of the present invention is an active matrix type liquid-crystal display device comprising a picture element whose switching transistor comprises of an Si layer having a carbon content, a hydrogen content and a rare gas content of $C \leq 1 \times 10^{18}$ cm$^{-3}$, $1 \times 10^{15}$ cm$^{-3} \leq H \leq 1 \times 10^{20}$ cm$^{-3}$ and $1 \times 10^{16}$ cm$^{-3} \leq$ rare gas, respectively, and having a difference of 15 nm or less between a maximum value and a minimum value of surface roughness.

BRIEF DESCRIPTION OF THE DRAWINGS

FIGS. 10A and 10B illustrate an example of time chart of a driving circuit of liquid-crystal display.

DESCRIPTION OF THE PREFERRED EMBODIMENTS

Figure 1:
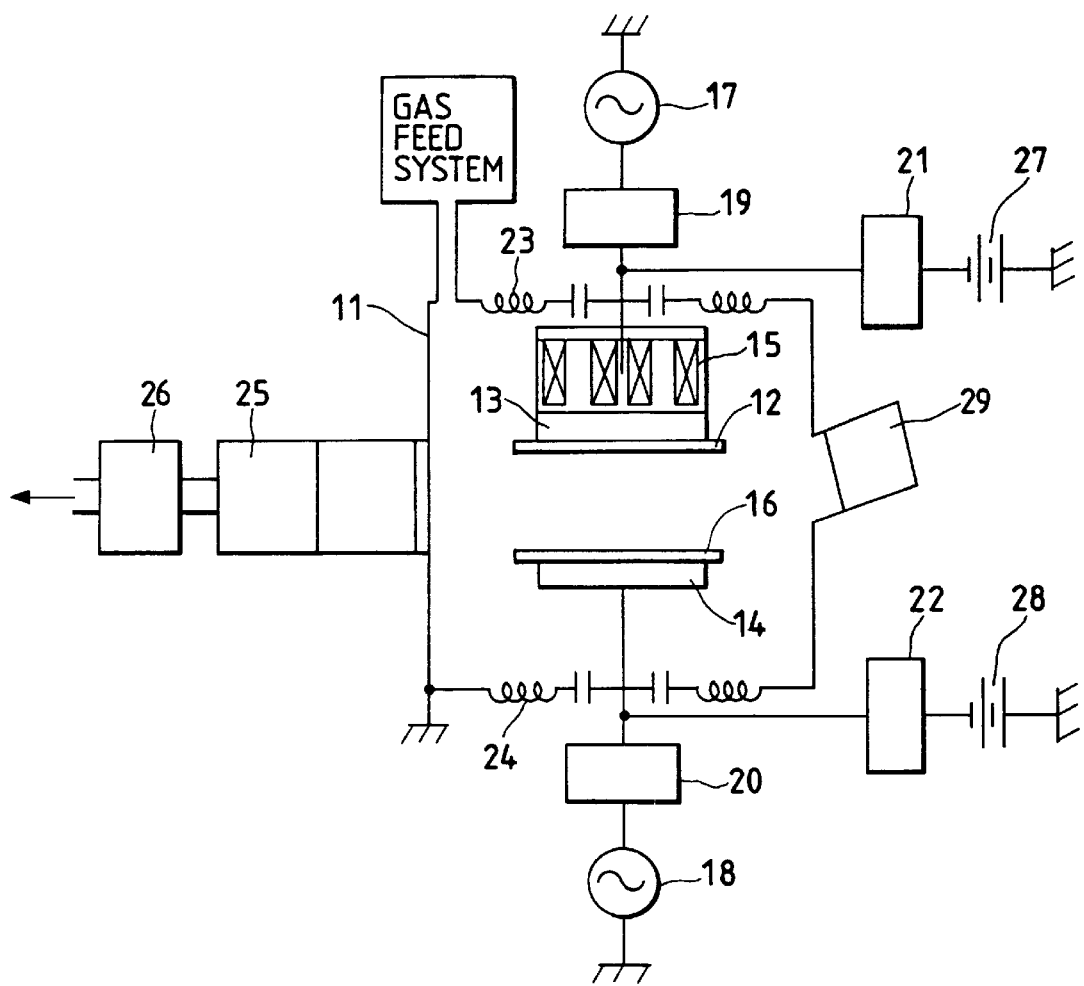
FIG. 1 is a diagrammatic illustration of a bifrequency excitation type bias sputtering apparatus employed for the working of the method of the present invention.

The method for forming a Si-deposited film of the present invention is characterized by a method of forming the Si-deposited film by a bias sputtering process comprising the steps of generating plasma between a target electrode holding a target material provided in a vacuum container and a substrate electrode holding a substrate for forming thereon the Si-deposited film, provided opposingly to the target electrode, by the use of a high-frequency energy to cause the target material to undergo sputtering, and applying a bias voltage to at least one of the target electrode and the substrate electrode to form the Si-deposited film, comprised of atoms deposited by sputtering on the substrate. A mixed-gas environment comprising a mixture of an inert gas and a hydrogen gas is formed in the vacuum container, and the target material is subjected to sputtering while controlling $H_2O$ gas, CO gas and $CO_2$ gas in the mixed-gas environment to have a partial pressure of $1.0 \times 10^{-8}$ Torr or less each, to form the Si-deposited film on the substrate while maintaining a substrate temperature in the range of from 400° C. to 700° C.

The present invention may also embrace an embodiment in which the substrate is irradiated with plasma ions before the film formation to clean the surface of the substrate.

The present invention may also embrace an embodiment in which a high-frequency power applied to the substrate has a frequency higher than the frequency of a high-frequency power applied to the target.

According to the present invention, $H_2O$ gas, CO gas and $CO_2$ gas in a vacuum chamber of a bias sputtering apparatus are each made to have a partial pressure of $1.0 \times 10^{-8}$ Torr or less, the substrate temperature is maintained at 400° C. to 700° C., and the epitaxial growth by sputtering is carried out in a mixed-gas environment comprised of an inert gas and a hydrogen gas. Thus, the following advantages can be expected:

(1) The coefficient at which inert atoms such as argon atoms, and helium atoms that are the atoms constituting the plasma, and not the atoms constituting the deposited film, deposit on the substrate greatly decreases. As for hydrogen atoms that are the atoms constituting the plasma and not the atoms constituting the deposited film, their force to combine with the Si atoms constituting the substrate greatly decreases when the substrate temperature is 400° C. or above. Hence, any inclusion of inert atoms and hydrogen atoms, other than deposited film constituent atoms, into the deposited film can be greatly decreased.

(2) The quantity of the carbon atoms having a great influence on the device performance even when incorporated into the deposited film in a small quantity can be greatly decreased on account of the reaction with hydrogen gas.

In the present invention, the semiconductor substrate has an Si layer having a carbon content, a hydrogen content and a rare gas content of $C \leq 1 \times 10^{18}$ cm$^{-3}$, $1 \times 10^{15}$ cm$^{-3} \leq H \leq 1 \times 10^{20}$ cm$^{-3}$ and $1 \times 10^{16}$ cm$^{-3} \leq$ rare gas, respectively, and has a difference of 15 nm or less between a maximum value and a minimum value of surface roughness. The Si layer of the present invention may be monocrystalline, polycrystalline or amorphous. The reason why it is preferable for the carbon content, hydrogen content and rare gas content to be in the above amounts will be explained below.

First, with regard to the carbon content, the incorporation of carbon into the Si layer may cause a distortion of crystals and also an increase in dangling bonds, resulting in a deterioration of crystallinity, and electrical characteristics after all. In particular, it may result in deterioration of characteristics concerned with carriers, such as off-leak and mobility. It is better for the Si layer to incorporate less carbon, and the Si layer formed by sputtering according to the method of the present invention, conjointly with other conditions, has made it possible for the first time to provide the Si layer containing carbon in a small amount.

Next, with regard to the hydrogen, hydrogen is known to terminate dangling bonds in polycrystalline Si films, rather than in monocrystalline Si films and hence improves electrical characteristics. In conventional processes, Si films are treated with hydrogen by plasma-assisted CVD or the like to incorporate hydrogen. In the present invention, however, the hydrogen can be incorporated at the initial Si film formation, and hence the step of hydrogen treatment can be omitted. Moreover, since it is incorporated at the time of Si deposition, the dangling bonds can be terminated efficiently, so that the off-leak characteristics and S-coefficient characteristics (rise characteristics) themselves are improved. There is another advantage in incorporation of hydrogen at the time of Si deposition since it enables removal of the carbon. The hydrogen content is required to increase as the crystallinity of the Si layer decreases, and the hydrogen content increases in the order of monocrystalline, polycrystalline and amorphous.

As for the rare gas, a sputtering gas which is a rare gas such as Ar is electrically inert and does not deteriorate electrical characteristics. However, its inclusion in excess causes an increase in crystal strain, so that dangling bonds increase to deteriorate electrical characteristics. However, its incorporation in an appropriate amount causes no deterioration of electrical characteristics themselves and enables formation of dense films, which can be oriented to (111) face with ease. In particular, when the Si layer is monocrystalline, as having dense crystal structure, a denser layer can be obtained using a trace amount of rare gas (X). The monocrystalline layer, however, may deteriorate if there is too much X. When the Si layer is polycrystalline, Si atoms are not so densely arranged as the monocrystalline layer and Si atoms have a greater degree of freedom. Hence, the incorporation of X in a larger amount than that in the monocrystalline Si layer can be more effective.

When the Si layer is amorphous, Si atoms have a much greater degree of freedom, and hence the incorporation of X in a much larger amount than that in the polycrystalline layer enables formation of a denser film. Among rare gases (X), Ar is most effective, as having an atomic radius (elementary radius) which is close to those of Si atoms. Needless to say, other rare gases (X) are also similarly effective.

Finally with regard to the surface roughness, if the surface roughness is more than 15 nm as a pV value, electric field concentration tends to occur because of such configuration, and causes deterioration of breakdown strength of gate oxide films when MOS transistors are fabricated. Since the interface between the substrate and the gate oxide film is very rough, problems may occur such that the mobility deteriorates.

Si films satisfying all of these features show very good characteristics in respect of electrical characteristics. The carbon (C) content, hydrogen (H) content and rare gas (X) content that can bring about such good characteristics are $C \leq 1 \times 10^{18}$ $cm^{-3}$, $1 \times 10^{15}$ $cm^{-3} \leq H \leq 1 \times 10^{20}$ $cm^{-3}$ and $1 \times 10^{16}$ $cm^{-3} \leq X$, respectively. When the Si layer is monocrystalline, they are more preferably $C \leq 5 \times 10^{17}$ $cm^{-3}$, $1 \times 10^{16}$ $cm^{-3} \leq H \leq 1 \times 10^{19}$ $cm^{-3}$ and $1 \times 10^{16}$ $cm^{-3} \leq X < 1 \times 10^{18}$ $cm^{-3}$. In such a monocrystalline Si layer, they are most preferably $C \leq 1 \times 10^{17}$ $cm^{-3}$, $1 \times 10^{16}$ $cm^{-3} \leq H \leq 1 \times 10^{17}$ $cm^{-3}$ and $1 \times 10^{16}$ $cm^{-3} \leq X \leq 1 \times 10^{19}$ $cm^{-3}$, respectively. When the Si layer is polycrystalline, they are more preferably $C \leq 5 \times 10^{17}$ $cm^3$, $1 \times 10^{17}$ $cm^{-3} \leq H \leq 1 \times 10^{19}$ $cm^{-3}$ and $1 \times 10^{16}$ $cm^{-3} \leq X \leq 1 \times 10^{19}$ $cm^{-3}$, respectively. In such a polycrystalline Si layer, they are most preferably $C \leq 1 \times 10^{17}$ $cm^{-3}$, $1 \times 10^{18}$ $cm^{-3} \leq H \leq 1 \times 10^{19}$ $cm^{-3}$ and $1 \times 10^{17}$ $cm^{-3} \leq X \leq 1 \times 10^{19}$ $cm^{-3}$, respectively. When the Si layer is amorphous, they are more preferably $C \leq 5 \times 10^{17}$ $cm^{-3}$, $1 \times 10^{17}$ $cm^{-3} \leq H \leq 1 \times 10^{20}$ $cm^{-3}$ and $1 \times 10^{17}$ $cm^{-3} \leq X \leq 1 \times 10^{20}$ $cm^{-3}$, respectively. In such an amorphous Si layer, they are most preferably $C \leq 1 \times 10^{17}$ $cm^3$, $1 \times 10^{19}$ $cm^{-3} \leq H \leq 1 \times 10^{20}$ $cm^3$ and $1 \times 10^{18}$ $cm^3 \leq X \leq 1 \times 10^{19}$ $cm^{-3}$, respectively.

FIG. 1 illustrates a bifrequency excitation type bias sputtering apparatus employed for the working of the method of the present invention. In the drawing, reference numeral 11 denotes a vacuum chamber; 12, a target; 13, a target supporting member; 14, a substrate supporting member; 15, a permanent magnet; 16, a substrate; 17, a 100 MHz high-frequency power source; 18, a 190 MHz high-frequency power source; 19 and 20, matching circuits; 21, a low-pass filter for the target; 22, a low-pass filter for the substrate; 23 and 24, band pass filters; 25, a magnetic levitation type tandem turbo molecular pump; 26, a dry pump; 27, a DC power source for determining the DC potential of the target; 28 a DC power source for determining the DC potential of the substrate; and 29, a xenon lamp for heating the substrate.

The vacuum chamber 11 is made of a material that lessen gas escape. For example, SUS316 is used as a structural material, and the inner surface of the chamber is surface-treated in the following way: The surface is subjected to combined electrolytic polishing and electrolytic polishing and thereafter mirror-finished to a smoothness of maximum height roughness Rmax<0.1 μm, on the surface of which a passive oxide film is further formed by the use of high-purity oxygen. The material is by no means limited to the high-purity oxygen so long as any impurity contamination hardly occurs when the substrate temperature is elevated.

A gas exhaust system is comprised of the tandem type turbo molecular pump 25 comprising magnetic levitation type turbo molecular pumps arranged in tandem and the dry pump 26 serving as an auxiliary pump. This exhaust system is an oil-free system that causes only slight impurity contamination. The second-stage turbo molecular pump is a pump of a large flow rate type, and can maintain exhaust velocity even at a degree of vacuum on the order of $10^{-3}$ Torr during plasma generation. The gas exhaust system, including a mass flow controller and filters, is set up using SUS316 as in the case of the vacuum chamber and its inner surface is also subjected to surface treatment by polishing and formation of a passive oxide film so that any unauthorized impurities can be prevented from entering when processing gases are fed into it.

The substrate 16 is guided into the vacuum chamber 11 through a load lock chamber (not shown) provided adjoining to the vacuum chamber, and thus the unauthorized impurities are prevented from entering in the vacuum chamber.

As a gas feed system, an ultraclean gas feed system and/or an oil-free ultrahigh-vacuum extraction system is/are employed so that the plasma constituent atoms other than the film constituent atoms can be prevented from being included in the film during the formation of epitaxial films.

A high-frequency energy may preferably be applied to the substrate in order to form a more stable plasma. Especially when the substrate is comprised of an insulating material, the frequency of high-frequency energy may be adjusted, so that the potential of the substrate surface can be adjusted. The high-frequency energy applied to the substrate may preferably have a frequency higher than that of the high-frequency energy applied to the target.

As the processing gas to generate plasma, a high-purity gas comprising hydrogen gas mixed with a single material inert gas such as argon or helium or a mixed gas of several kinds of these inert gases. Here, the $H_2O$ gas, CO gas and $CO_2$ gas contained in the processing gas may each preferably be in a content of 1 ppm or less, and more preferably 100 ppb or less.

The pressure inside the vacuum chamber in the course of the film formation may be kept within the range where discharge takes place. In particular, it may preferably be within the range of from 1 to 50 mTorr.

The substrate may preferably have a clean, bare surface. For example, the substrate provided in the vacuum chamber may be subjected to surface cleaning by irradiation with ions while controlling high-frequency power, DC voltage, gas pressure and so forth so that its surface may have no damage due to irradiation with ions. Here, for the same reasons as in the film formation, the substrate temperature should be in the range of from 400° C. to 700° C., and the cleaning gas should have a high purity, comprising hydrogen gas mixed with a single material inert gas such as argon or helium or a mixed gas of two or more kinds of inert gases. $H_2O$ gas, CO gas and $CO_2$ gas should each preferably be made to have a partial pressure of $1.0 \times 10^{-8}$ Torr or less.

In the film formation, the gas pressure inside the chamber, the high-frequency power supplied to the target, the DC voltage applied to the target and the high-frequency power optionally applied to the substrate may preferably be controlled so that the energy possessed by one ion made incident on the substrate can be controlled within the range that may cause no damage on the substrate. When, for example, the substrate is formed of Si and the plasma is mainly comprised of argon, the energy possessed by one argon ion should be controlled to be 40 eV or less. The value 40 eV corresponds to the threshold value at which the sputtering of Si is caused by argon, and is an upper limit of ion irradiation energy that causes no damage on the substrate surface comprising Si.

As a substrate heating means, a lamp irradiation means such as a xenon lamp or a halogen lamp that may causes fewer impurities or a resistance heating means should be used.

In the method of the present invention, a monocrystalline film of the substance constituting the target is epitaxially grown in accordance with the information obtained on crystal orientation of the monocrystalline substrate used as a base. At this time, the dopant in the target is incorporated into the film formed, in the same proportion as it is contained in the target. For example, when a Si film is formed using a Si target containing the dopant in a given proportion, the resistivity as properties of the resulting film can be optimized to an extent substantially equal to that of Si bulk. Especially when the substrate temperature is within the range of from 500° C. to 600° C., the resistivity of the film formed is 100 to 110% of bulk that of Si, showing very good properties. A film formed at substrate temperatures ranging from 500° C. to 550° C. has the smallest resistivity. This fact shows that almost all the dopant in the film has been activated.

According to the method of the present invention, carbon atoms included into the film can be greatly decreased on account of their chemical reaction with hydrogen, so that high-quality epitaxial films can be formed. According to the method of the present invention, the substrate temperature is kept not lower than 400° C., and hence the hydrogen having the function of removing unauthorized impurities can be very easily prevented from being included into the epitaxial film. If the substrate temperature is lower than 400° C., the incorporation of hydrogen into the film may increase to greatly deteriorate film quality. If, on the other hand, the substrate temperature is higher than 700° C., the partial pressure of CO and $CO_2$ around $H_2O$ may increase to deteriorate of film quality and also to make it impossible to meet the demand for making dopant profiles sharper or shallower.

EXAMPLES

The present invention will be described in greater detail by giving Examples. The present invention is by no means limited by these.

Example 1

Using the bifrequency excitation type bias sputtering apparatus shown in FIG. 1, epitaxial films were formed on Si (100) just-oriented substrates in the following way. As the target, p-type FZ 120 mm diameter Si doped with boron to have a resistivity of 0.014 Ω·cm was used.

Figure 2A:
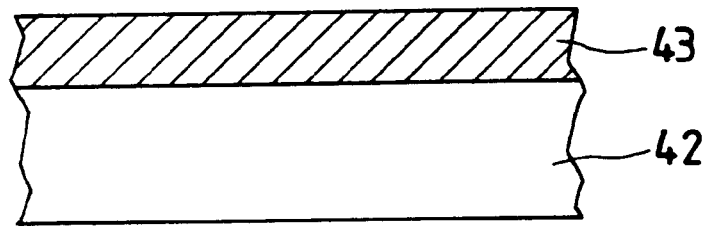
FIGS. 2A to 2C are flow charts to illustrate a process for producing a substrate when the method of the present invention is carried out.
Figure 2B:
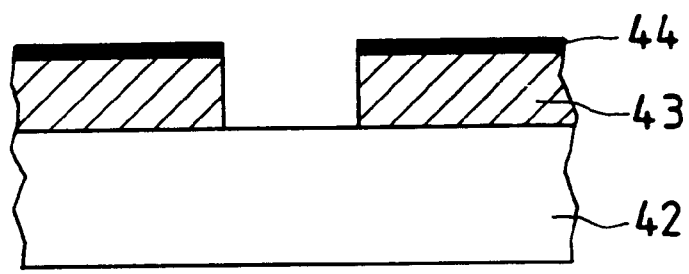

First, as shown in FIG. 2A, thermal oxidation was carried out on the Si substrate 42 at 1,000° C. for 54 minutes by resistance heating in an environment comprising $H_2$ gas and 02 gas fed at a flow rate of 2 l/min and 4 l/min, respectively, to form an $SiO_2$ film 43 with a thickness of about 200 nm. From the upper part of this $SiO_2$ film 43, a resist 44 was spin-coated, followed by known exposure and development. Thereafter, the resulting substrate was moved to a parallel flat type RIE (reactive ion etching) apparatus, and ion etching was carried out under the following conditions to remove the $SiO_2$ film so that a pattern was formed on the Si substrate as shown in FIG. 2B. This pattern was comprised of a plurality of valleys of 1 μm wide and 1 μm deep and a plurality of squares of 10 μm×10 μm to 1 mm×1 mm in size as a plannar shape viewed from the upper part.

TABLE 1

| RIE conditions | |
| --- | --- |
| Gas flow rate: | $CHF_3$, 30 sccm $O_2$, 5 sccm |
| RF powder: | 700 W |
| Pressure: | 0.13 Torr |
| Time: | 3 minutes |

Figure 2C:
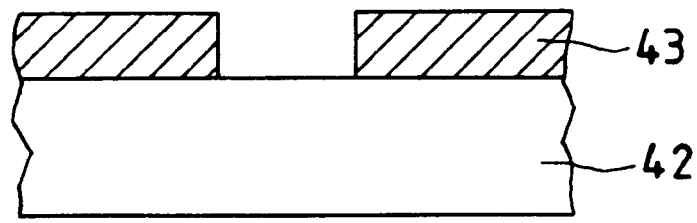

From the substrate having been subjected to patterning in this way, the resist was separated to obtain the substrate as shown in FIG. 2C.

Next, this substrate was cleaned by a known wet process, and then set on an electrostatic chuck serving as the substrate holding member 14 provided in the chamber 11 of the bias sputtering apparatus shown in FIG. 1, followed by heating to have a substrate temperature of 550° C. Subsequently, argon gas and hydrogen gas were fed in a given proportion from a gas feed system comprising an ultragas feed clean system, and the pressure inside the vacuum chamber was adjusted to 15 mTorr. DC voltage on the side of the substrate 16 and DC voltage on the side of the target 12 were set at prescribed values as shown below and a high-frequency power was supplied to the chamber 11 to thereby carry out ion irradiation surface cleaning by the action of plasma to remove molecules adsorbed on the substrate surface. Next, the DC voltage on the side of the substrate 16, the DC voltage on the side of the target 12 and the high-frequency power were immediately set at prescribed values as shown below, and an Si epitaxial film with a thickness of about 100 nm was formed at a substrate temperature of 550° C. Cleaning of the substrate and the film formation were carried out under conditions also shown below, provided that the frequency of the high-frequency power supplied from the target side was kept constant at 100 MHz.

Figure 3:
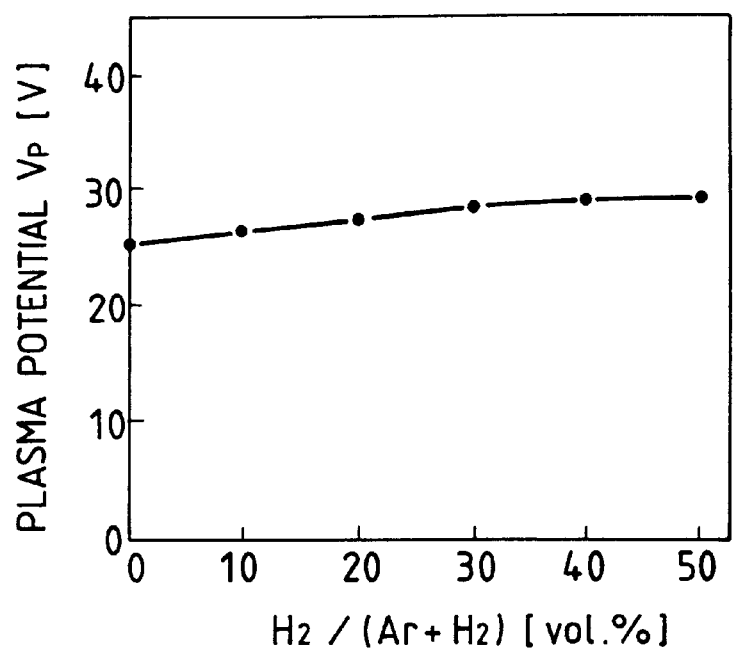
FIG. 3 is a graph to show the relationship between plasma potential and a hydrogen gas content in an embodiment of the present invention.

Substrate surface cleaning conditions
Target side high-frequency power: 5 W
Target side DC voltage: −5 V
Ar gas pressure: 15 mTorr
$H_2$ gas/(Ar+$H_2$) gas volume ratio: 20%
Substrate side DC voltage: 10 V
Substrate temperature: 550° C.
Processing time: 5 minutes
Si epitaxial film forming conditions
Target side high-frequency power: 100 W
Target side DC voltage: −150 V
Ar gas pressure: 15 mTorr
$H_2$ gas/(Ar+$H_2$) gas volume ratio: 10 to 50%
Substrate side DC voltage: 10 V
Substrate temperature: 550° C.
Processing time: 5 minutes Plasma potential (hereinafter "Vp") at the time of the surface cleaning and at the time of the Si film formation was measured by a conventional Langmuir probe method to obtain the results as shown in FIG. 3. In the drawing, the Vp is indicated as the ordinate and the hydrogen gas content in the mixed gas of argon gas and hydrogen gas is indicated as the abscissa in volume ratio. In the present Example, the Vp increased with an increase in the content of hydrogen gas in the mixed gas. At this time, substrate potential (hereinafter "Vs") is fixed and kept constant by the DC power source on the substrate side. The ion irradiation energy of the ions made incident on the substrate surface is equal to the potential difference between the Vp and the substrate potential Vs, and hence, when the Vp varies, the ion irradiation energy can be controlled by changing the substrate potential Vs. Thus, the substrate potential Vs was also changed as the plasma potential Vp varied.

With regard to thin films formed on substrates in the manner as described above;

(1) crystal analysis was carried out by electron ray diffraction;
(2) content of impurity atoms of argon, carbon and hydrogen each was measured by SIMS (secondary ion mass spectroscopy);
(3) reverse-current density at p-n junctions at the patterned portions was measured; and

Example 2

Next, epitaxial films were formed in the same manner as in Example 1 except that the $H_2/(Ar+H_2)$ ratio was fixed at 20%, while changing the substrate temperature in the range of from 300° C. to 800° C. Properties of epitaxial films thus obtained are shown in Table 2.

TABLE 2

| | \multicolumn{7}{c}{Substrate temperature} | | | | | | |
|---|---|---|---|---|---|---|---|---|---|---|---|---|---|
| 300° C. | | 400° C. | | 500° C. | | 550° C. | | 600° C. | | 700° C. | | 800° C. | |
| Resistivity (Ω · cm): | | | | | | | | | | | | | |
| $1.9 \times 10^{-2}$ | C | $1.5 \times 10^{-2}$ | A | $1.4 \times 10^{-2}$ | A | $1.4 \times 10^{-2}$ | A | $1.5 \times 10^{-2}$ | A | $1.6 \times 10^{-2}$ | A | $9.0 \times 10^{-2}$ | D |
| Argon content (cm$^{-3}$): | | | | | | | | | | | | | |
| $8.0 \times 10^{18}$ | D | $1.3 \times 10^{18}$ | B | $1.0 \times 10^{18}$ | B | $8.8 \times 10^{17}$ | A | $8.0 \times 10^{17}$ | A | $6.0 \times 10^{17}$ | A | $8.0 \times 10^{18}$ | D* |
| Carbon content (cm$^{-3}$): | | | | | | | | | | | | | |
| $6.0 \times 10^{16}$ | A | $8.8 \times 10^{16}$ | A | $1.5 \times 10^{17}$ | A | $2.1 \times 10^{17}$ | B | $3.1 \times 10^{17}$ | B | $6.0 \times 10^{17}$ | C | $1.4 \times 10^{19}$ | D |
| Hydrogen content (cm$^{-3}$): | | | | | | | | | | | | | |
| $1.3 \times 10^{20}$ | D | $9.4 \times 10^{18}$ | B | $1.1 \times 10^{18}$ | B | $4.3 \times 10^{17}$ | A | $9.7 \times 10^{16}$ | A | $9.7 \times 10^{-16}$ | A | $9.7 \times 10^{16}$ | A |
| p-n Junction reverse-current density (A/cm$^2$): | | | | | | | | | | | | | |
| $1.9 \times 10^{-9}$ | C | $5.5 \times 10^{-10}$ | | $2.0 \times 10^{-10}$ | A | $2.0 \times 10^{-10}$ | A | $4.0 \times 10^{-10}$ | A | $6.0 \times 10^{-10}$ | A | $1.4 \times 10^{-8}$ | D |
| Electron ray diffraction: | | | | | | | | | | | | | |
| Streaks B | | K-lines A | | K-lines A | | K-lines A | | K-lines A | | K-lines A | | Streaks C | |
| Step coverage: | | | | | | | | | | | | | |
| C | | B | | A | | A | | A | | A | | A | |
| Background vacuum degree (Torr): | | | | | | | | | | | | | |
| $2.0 \times 10^{-10}$ | | $4.0 \times 10^{-10}$ | | $8.0 \times 10^{-10}$ | | $3.0 \times 10^{-9}$ | | $7.0 \times 10^{-9}$ | | $1.0 \times 10^{-8}$ | | $8.0 \times 10^{-8}$ | |

K lines: Kikuchi lines, A: Very good, B: Good, C: Ordinary, D: Poor, -: Unmeasuarable
*Crystallizability was a poor and cause an increase in the Ar content.

(4) step coverage was evaluated by SEM (scanning electron microscopy) observation.

As a result of the electron ray diffraction, it was ascertained that all the thin films were epitaxially grown without any great difference.

Figure 4:
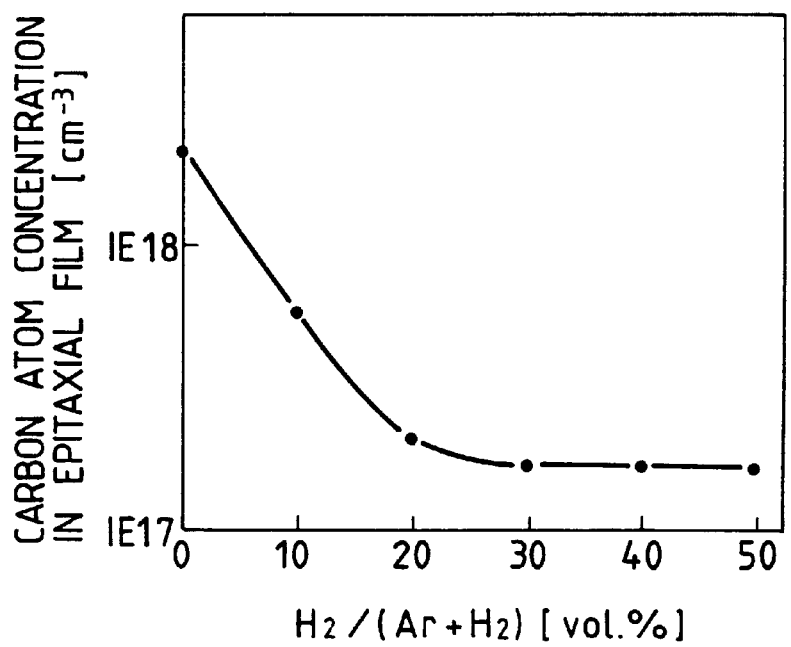
FIG. 4 is a graph to show the relationship between carbon atom concentration in an epitaxial film and hydrogen gas content in a processing gas, in an embodiment of the present invention.

Concentration of carbon atoms incorporated into the film was graphically represented, as shown in FIG. 4. In the drawing, carbon atom concentration in the epitaxial film was indicated as the ordinate, and the hydrogen gas content in the mixed gas of argon gas and hydrogen gas is indicated as the abscissa in volume ratio. As shown in FIG. 4, the carbon atom concentration in the film decreases with an increase in the content of hydrogen gas in the mixed gas, and it can be ascertained that the hydrogen gas is effective for preventing inclusion of carbon atoms.

Figure 5:
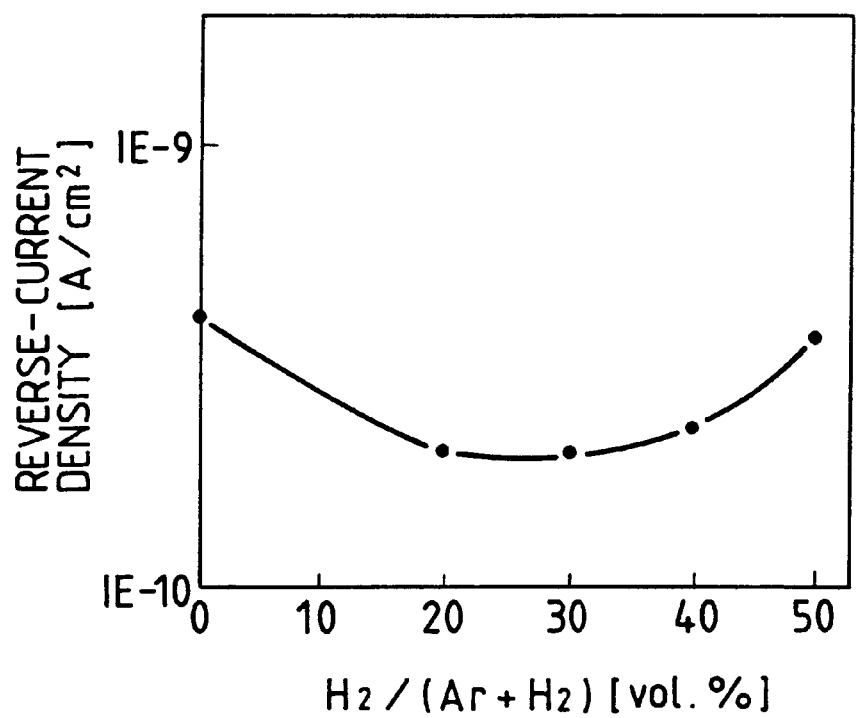
FIG. 5 is a graph to show the relationship between reverse-current density at p-n junctions and hydrogen gas content in an embodiment of the present invention.

FIG. 5 shows the relationship between the reverse-current density at p-n junctions and the hydrogen gas content. In the drawing, the reverse-current density is indicated as the ordinate, and the hydrogen gas content in the mixed gas of argon gas and hydrogen gas is indicated as the abscissa in volume ratio. As shown in FIG. 5, in the present Example, a minimum value is seen in the vicinity of 30 vol. % for the hydrogen gas content. This is considered due to the fact that recombination currents have been suppressed because the carbon concentration in the film decreases so far as the hydrogen content is 30 vol. %

As for the step coverage, no great difference ascribable to hydrogen gas was seen.

As shown in Table 2, a large quantity of hydrogen atoms remain when the substrate temperature is lower than 400° C. On the other hand, when it is higher than 700° C., the argon content and carbon content increase and also the reverse-current density at p-n junctions increases. The dopant profile began to become a little dull. The argon content is small when the substrate temperature is in the range of from 400° C. to 700° C. With regard to the reverse-current density at a p-n junction reverse voltage of 5 V, it is ascertained that minimum values are seen when the substrate temperature is 500 to 550° C. and the value abruptly increases the substrate temperature is lower than 400° C. or higher than 700° C. The step coverage is greatly improved when it is 400° C. or above.

In an instance in which the substrate temperature and the $H_2/(Ar+H_2)$ ratio were set constant at 550° C. and 20%, respectively, without any changes in other conditions but the partial pressure of $H_2O$, CO and $CO_2$ each was made higher than $1\times10^{-8}$, electron ray diffracted images became greatly irregular to decrease crystallizability.

Example 3

A bipolar transistor (BPT) was fabricated in the following way.

Figure 6:
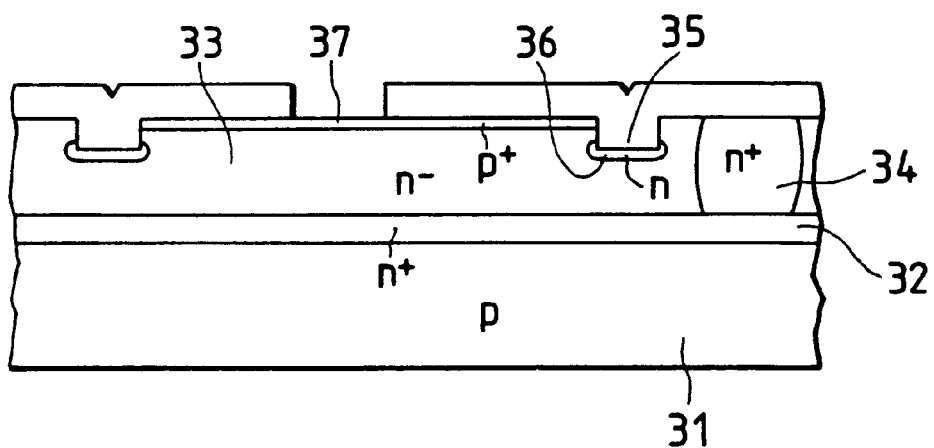
FIG. 6 illustrates an example of the constitution of a base region in a BPT (bipolar transistor).

FIG. 6 illustrates an example of the constitution of a base region in the BPT.

On the surface of a p-type Si substrate 31 with a resistivity of 4 Ω·cm, an $n^+$-type buried layer 32 was formed by a conventional diffusion process.

On the buried layer 32 thus formed, an n—type region 33 with a layer thickness of 1.2 μm was formed by a conventional epitaxial film forming process.

Subsequently, an $n^+$-type region 34 for decreasing the collecter resistance of the BPT was formed in the $n^-$-type region 33 by a conventional diffusion process.

Next, in the $n^-$-type region 33, As ions were implanted at a dose of $2 \times 10^{13}$ cm$^{-2}$ by conventional ion implantation to form a channel stop region 36, followed by normal pressure CVD to form an SiO$_2$ film, which was then etched according to the RIE etching step previously described, to form a device separating region 35. Reference numeral 37 denotes a $p^+$-type base region formed of a film epitaxially grown by bias sputtering.

Next, using the RF-DC combined bias sputtering apparatus as shown in FIG. 1, an about 300 nm thick Si epitaxial film was formed as a base region by the use of a target having a boron concentration of $1.0 \times 10^{18}$ cm$^{-3}$. The film was formed under conditions shown below.
Substrate surface cleaning conditions
Target side high-frequency power: 5 W
Target side DC voltage: −5 V
Ar gas pressure: 15 mTorr
H$_2$ gas/(Ar+H$_2$) gas volume ratio: 20%
Substrate side DC voltage: 10 V
Substrate temperature: 550° C.
Processing time: 5 minutes
Si epitaxial film forming conditions
Target side high-frequency power: 100 W
Target side DC voltage: −150 V
Ar gas pressure: 15 mTorr
H$_2$ gas/(Ar+H$_2$) gas volume ratio: 10%
Substrate side DC voltage: 5 V
Substrate temperature: 550° C.
Processing time: 15 minutes The Vp in the course of the Si film formation was 25 eV. The Vs was set at 5 eV. Hence, the argon ions in plasma gained an energy of 20 eV corresponding to the potential difference between them, with which the substrate had been irradiated. This value was a value suited to carry out epitaxial growth without damaging the substrate. Meanwhile, the Vp and Vs in the course of the substrate surface cleaning was 18 eV and 10 eV, respectively, and the argon ion irradiation energy on the substrate surface was 8 eV.

Then, a substrate with contact holes made therein for forming an emitter was made ready, and was cleaned by a conventional wet process, followed by RF-DC combined bias sputtering again, to form an about 500 nm thick Si epitaxial film on the substrate. The target was comprised of $1 \times 10^{21}$ cm$^{-3}$ $n^+$FZ (100) Si. The film was formed under conditions shown below.
Substrate surface cleaning conditions
Target side high-frequency power: 5 W
Target side DC voltage: −5 V
Ar gas pressure: 15 mTorr
H$_2$ gas/(Ar+H$_2$) gas volume ratio: 20%
Substrate side DC voltage: 15 V
Substrate temperature: 550° C.
Processing time: 5 minutes
Si epitaxial film forming conditions
Target side high-frequency power: 100 W
Target side DC voltage: −400 V
Ar gas pressure: 15 mTorr
H$_2$ gas/(Ar+H$_2$) gas volume ratio: 0%
Substrate side DC voltage: 5 V
Substrate temperature: 550° C.
Processing time: 5 minutes The Vp in the course of the Si film formation decreased to 20 eV since the target potential was set at −400 eV. The Vs was set at 0 eV. Hence, the argon ions in plasma gained an energy of 20 eV corresponding to the potential difference between them, with which the substrate had been irradiated. This value was a value suited to carry out epitaxial growth without damaging the substrate. Meanwhile, the Vp and Vs in the course of the substrate surface cleaning was 18 eV and 10 eV, respectively, and the argon ion irradiation energy on the substrate surface was 8 eV.

Figure 7:
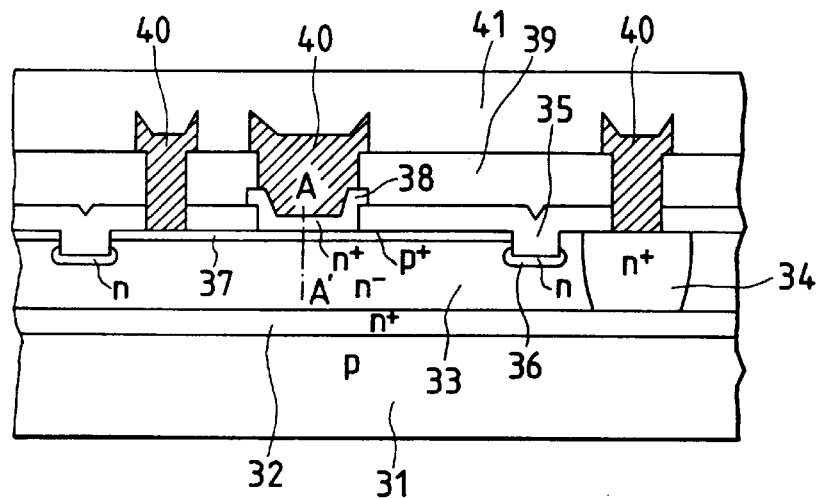
FIG. 7 illustrates an example of the constitution of an emitter region in the BPT.

The resulting film was subjected to patterning by a conventional process to form an emitter region. FIG. 7 illustrates an example of the constitution of the emitter region in the BPT.

An insulating film 39 comprised of SiO$_2$ with a layer thickness of 0.5 μm was deposited by conventional normal pressure CVD, and contact holes were formed by patterning, followed by conventional sputtering to superpose TiN and Al—Si—Cu in layers to form wiring electrodes 40.

An insulating film 41 comprised of SiO$_2$ was deposited, and an external withdrawing outlet was worked by a conventional semiconductor process.

Figure 8:
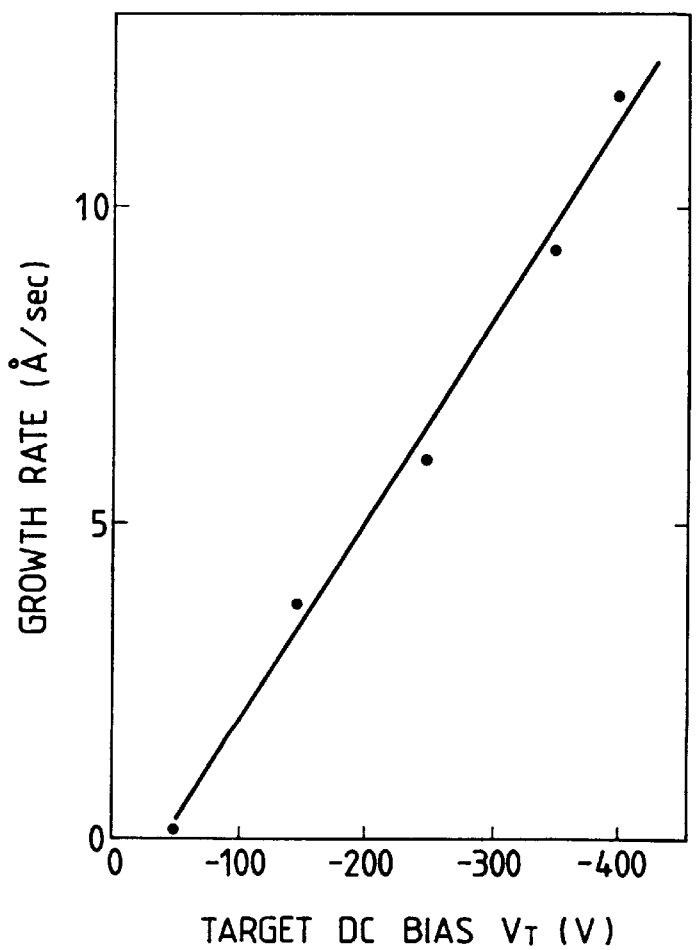
FIG. 8 is a graph to show the dependence of film formation rate on target bias in the bias sputtering.

The foregoing schematically illustrates a process for fabricating the BPT. What are most important in the process are the steps of forming the base and the emitter that influence the performance of the BPT. First, in the base region, in order to obtain a high-performance BPT, it is strongly demanded to make base resistance lower, suppress recombination currents in the base and at the base interface, and decrease irregularities thereof. Hence, it is strongly demanded to make the base region shallower, make the dopant profile more uniform, and make the base-collector interface and base-emitter interface clean and flat. The present invention has made it possible to achieve the film quality and interfacial state that can meet such demands. That is, the present invention has made it possible to obtain an epitaxial interface having a low reverse-current density and a sharp dopant profile and also free from unauthorized impurities such as naturally occurring oxide films. The present bias sputtering also enables easy formation of thin films, and is advantageous for making the profile shallower. It has been ascertained that BPTs having base regions of up to 10 nm can be fabricated and operated. FIG. 8 is a graph to show the dependence of film formation rate on target bias in the bias sputtering. Film forming conditions other than target bias are made constant, which are as shown below.
Substrate surface cleaning conditions
Target side high-frequency power: 5 W
Target side DC voltage: −5 V
Ar gas pressure: 15 mTorr
H$_2$ gas/(Ar+H$_2$) gas volume ratio: 20%
Substrate side DC voltage: 10 V
Substrate temperature: 550° C.
Processing time: 5 minutes
Si epitaxial film forming conditions
Target side high-frequency power: 100 W
Target side DC voltage: −50 to −400 V
Ar gas pressure: 15 mTorr
H$_2$ gas/(Ar+H$_2$) gas volume ratio: 10%
Substrate side DC voltage: 5 V
Substrate temperature: 550° C.

For example, when the target bias was −50 V, a film of 10 nm thick was obtained in about 10 minutes and the film showed a good crystallizability.

As for the emitter region, the recombination and irregularities at the emitter-base interface are as described above. With regard to the achievement of a lower emitter resistance, the emitter is comprised of monocrystalline Si while conventional DOPOS (doped poly-Si) emitters are comprised of polycrystalline Si, and hence it has become possible to achieve a lower emitter resistance.

Example 4

In the present Example, the apparatus in Example 1 previously described was used, and a p-type $1.0\times1011$ cm$^{-3}$ boron-doped Si (111) FZ wafer (made 4°-off in the direction of <211>) was used as the substrate. Substrate surface cleaning and film formation were carried out under conditions shown below.
Substrate surface cleaning conditions
Target side high-frequency power: 5 W
Target side DC voltage: −5 V
Xe gas pressure: 15 mTorr
H$_2$ gas/(Xe+H$_2$) gas volume ratio: 20%
Substrate side DC voltage: 9 V
Substrate temperature: 550° C.
Processing time: 5 minutes
Si epitaxial film forming conditions
Target side high-frequency power: 200 w
Target side DC voltage: −200 V
Xe gas pressure: 15 mTorr
H$_2$ gas/(Xe+H$_2$) gas volume ratio: 20%
Substrate side DC voltage: −7 V
Substrate temperature: 550° C.
Processing time: 5 minutes (150 nm)

The Vp in the course of the Si film formation was 22 eV. The Vs was set at −7 eV. Hence, the xenon ions in plasma gained an energy of 29 eV corresponding to the potential difference between them, with which the substrate had been irradiated. This value was a value suited to carry out epitaxial growth without damaging the substrate. Meanwhile, the Vp and Vs in the course of the substrate surface cleaning was 17 eV and 9 eV, respectively, and the xenon ion irradiation energy on the substrate surface was 8 eV.

Optimum values of plasma parameters at the time of Si film formation are different from those in the case of the Si (100) substrate as shown in Example 1 because of, e.g., the difference in surface energy between Si (111) and Si (100). However, with regard to the properties of Si thin films and others, very good films showing substantially the same results were obtained.

Example 5

In the present Example, the apparatus in Example 1 previously described was used, and Si (001) monocrystalline film was formed on the (1012) plane of an insulating material monocrystal sapphire (Al$_2$O$_3$) substrate. Since the substrate is an insulating material, the energy of ions with which the substrate is irradiated, influenced by the potential of the substrate surface (i.e., the difference between plasma potential and substrate potential), depends on the high-frequency power supplied to the substrate and the frequency of the high-frequency power. As the target material, an n-type $1.8\times10^{18}$ cm$^{-3}$ phosphorus-doped FZ Si (111) substrate was used, and Si was heteroepitaxially grown. Substrate surface cleaning and film formation were carried out under conditions shown below.
Substrate surface cleaning conditions
Target side high-frequency power: 5 W
Frequency of target side high-frequency power: 100 MHz
Target side DC voltage: −5 V
Substrate side high-frequency power: 10 W
Frequency of substrate side high-frequency power: 190 MHz
Ar gas pressure: 15 mTorr
H$_2$ gas/(Ar+H$_2$) gas volume ratio: 20%
Substrate side DC voltage: 5 V
Substrate temperature: 550° C.
Processing time: 5 minutes
Si epitaxial film forming conditions
Target side high-frequency power: 200 W
Frequency of target side high-frequency power: 100 MHz
Target side DC voltage: −200 V
He+Ar gas pressure: 15 mTorr
H$_2$ gas/(He+Ar+H$_2$) gas volume ratio: 20%
Substrate temperature: 550° C.
Processing time: 5 minutes (1,500 nm)

The Vp in the course of the Si film formation was 31 eV. The Vs was set at −1 eV. Hence, the argon ions in plasma gained an energy of 32 eV corresponding to the potential difference between them, with which the substrate had been irradiated. This value was a value suited to carry out epitaxial growth without damaging the substrate. Meanwhile, the Vp and Vs in the course of the substrate surface cleaning was 22 eV and 8 eV, respectively, and the argon ion irradiation energy on the substrate surface was 14 eV.

The thin film thus formed was subjected to light etching, a process carried out to make any crystal defects conspicuous, to observe etch pit density and also subjected to sectional TEM (transmission electron microscopy) to observe defect density such as layer defects or transfer. As a result, both the etch pit density and the defect density were each $1.0\times10^7$ to $1.0\times10^8$ pits or defects/cm.

In order to examine inclusion of Al into the Si thin film, measurement by SIMS was carried out to reveal that Al concentration in the Si thin film was a measurement limit $2\times10^{15}$ cm$^{-3}$ or less. Hole mobility of electrons was also measured by hole measurement to reveal that it showed a value of 240 cm$^2$/V·sec at normal temperature of 300 K, which was substantially equal to that of the bulk.

As is clear from the foregoing results, an SOS (sapphire on silicon) thin film was obtained. With regard to the problem of elastic compression strain occurring in the Si thin film because of a difference in the coefficient of thermal expansion between sapphire and Si ($9.5\times10^{-6}$/° C. and $4.2\times10^{-6}$/° C., respectively), it was $1\times10^8$ dyne/cm$^2$ or less because the growth temperature as low as 550° C., brings about a great improvement.

As is clear from what has been described above, the method for forming an Si-deposited film, of the present invention makes it possible to stably form high-quality monocrystalline thin films having a good step coverage and causing less film deposition defects. Since the films can be formed at low temperatures, it is also possible to prevent the dopant in the film from diffusing into unauthorized regions of the film deposited regions and to form a sharp profile.

Example 6

Example 6 is an example in which poly-Si (polycrystalline Si) films are formed on Si (100) substrates, using the bifrequency excitation type bias sputtering apparatus shown in FIG. 1. As the target, p-type FZ 120 mm diameter Si doped with boron to have a resistivity of 1.5 Ω·cm was used. To form the oxide film, thermal oxidation was carried out on the Si substrate at 1,000° C. for 54 minutes by resistance heating in an environment of $H_2$ gas: $O_2$ gas:2 l/min:4 l/min.

Next, the resulting substrate was cleaned by a known wet process, and then set on an electrostatic chuck serving as the substrate holding member 14 provided in the chamber 11 of the bias sputtering apparatus shown in FIG. 1, followed by heating to have a substrate temperature of 550° C. Subsequently, argon gas and hydrogen gas were fed in a given proportion from a gas feed system comprising an ultra gas feed clean system, and the pressure inside the vacuum chamber was adjusted to 15 mTorr. DC voltage on the side of the substrate 16 and DC voltage on the side of the target 12 were set at prescribed values as shown below and a high-frequency power was supplied to the chamber 11 to thereby carry out ion irradiation surface cleaning by the action of plasma to remove molecules adsorbed on the substrate surface. Next, the DC voltage on the side of the substrate 16, the DC voltage on the side of the target 12 and the high-frequency power were immediately set at pre-scribed values as shown below, and a poly-Si film with a thickness of about 100 nm was formed at a substrate temperature of 550° C. Cleaning of the substrate and the film formation were carried out under conditions also shown below, provided that the frequency of the high-frequency power supplied from the target side was kept constant at 100 MHz.

Substrate surface cleaning conditions
Target side high-frequency power: 5 W
Target side DC voltage: −5 V
Ar gas pressure: 15 mTorr
$H_2$ gas/(Ar+$H_2$) gas volume ratio: 20%
Substrate side rf frequency: 190 MHz
Substrate side high frequency power: 5 W
Substrate temperature: 550° C.
Processing time: 5 minutes
Poly-Si film forming conditions
Target side high-frequency power: 100 W
Target side DC voltage: −150 V
Ar gas pressure: 15 mTorr
$H_2$ gas/(Ar+$H_2$) gas volume ratio: 10 to 50%
Substrate side high frequency: 190 MHz
Substrate side high frequency power: 20 W
Substrate temperature: 550° C.
Processing time: 10 minutes Plasma potential at the time of the surface cleaning and at the time of the poly-Si film formation was measured by a conventional Langmuir probe method. As a result, the energy of ions applied on the substrate was 8 eV at the time of the surface cleaning and 30 eV at the time of the poly-Si deposition. The deposited film was in a thickness of about 100 nm, and a poly-Si film oriented to (111) was formed. Its average crystal grain diameter was 800 angstroms and surface roughness was 10 nm as a peak-to-valley value (PV value). Regarding the orientation, the orientation to the (111) closest packed face can be made easily by depositing the film while ion irradiation is carried out. While the conditions depend on ionic energy, substrate temperature and so forth, the orientation has a strong dependence on the energy of ions applied on the surface, and can be most easily made at 25 eV to 40 eV as ion irradiation energy. With regard to the surface roughness, smoothness is improved when the product of ionic energy value and irradiation density is great. If, however, the ionic energy value is too large, the damage due to sputtering becomes greater to cause an increase in surface roughness. It is most effective to increase the irradiation density, and accordingly the ionic energy value is made smaller and the energy imparted only to Si atoms present in the vicinity of the surface is made greater, whereby the surface migration can be promoted and the surface energy can become smaller, i.e., the surface smoothness can improve. Raising substrate temperature may also be effective. In the present Example, the carbon atom content, hydrogen atom content and Ar atom content were $9 \times 10^{17}$ $cm^{-3}$, $9 \times 10^{18}$ $cm^{-3}$ and $1 \times 10^{19}$ $cm^{-3}$, respectively.

We have mentioned forming the polycrystalline Si so far, if the substrate temperature is reduced to 400° C., we also can form the amorphous Si with good quality. Therefore, we can attain more temperature reduction of the substrate.

A thin-film transistor (TFT) was further formed on this poly-Si film. First, the poly-Si film formed in the manner described above was subjected to patterning, and a gate oxide film was formed thereon. Taking account of substrates (e.g., glass substrates) that must be processed at low temperatures, the gate oxide film was formed as a deposited film by CVD (chemical vapor deposition), though resulting in some lowering of characteristics. A thermal oxide film, having less boundary levels, may be used as the gate oxide film, but on the other hand there are disadvantages such that high-temperature processing is required, substrate materials are restricted, and hydrogen escapes at this step. No particular limitations are required. TFT of a stagger type will be described here. Needless to say, a structure of a reverse stagger type in which the gate oxide film is used as a base of the poly-Si film may also be used without any problem at all. As a next step, a poly-Si film as a gate electrode is deposited. The Si film having been described in the present invention may be used, or the film may be formed by LPCVD (low-pressure chemical vapor deposition) usually used. In the case when the Si film described in the present invention is used, any films containing a dopant as the target at a high density may be used, so that it becomes possible to omit the step of ion implantation carried out in a subsequent step. After the poly-Si electrode has been subjected to patterning, source-drain ion implantation is carried out. If necessary, an LDD structure or offset structure may be used. In the present Example, a 1 μm offset structure was used. Subsequently, the oxide film, an interlayer film, was formed and then subjected to patterning. Thereafter, an Al/Si electrode as formed and then subjected to patterning. Since in the present invention the hydrogen has been already incorporated into the Si film at the time of poly-Si deposition, the step of hydrogenation by plasma-assisted CVD is not taken. The TFT thus formed had very good characteristics, having a mobility of 50 $cm^2$/Vsec and an off-leak of $3 \times 10^{-12}$/μm. Its S-coefficient was 212 mV/decade, and also gate oxide film breakdown strength was 8 MV/cm or more, which were good characteristics for TFT operation.

Thus, the poly-Si can be deposited without use of complicated processes such as laser annealing and solid-phase growth, the process can be simplified and the TFT with good characteristics can be formed at a low-temperature process. Hence, this brings about a very great effect that the films can be formed inexpensively at a high degree of freedom on substrates. This TFT also has a great effect on channel areas and is very effective in view of characteristics, without particularity about the stagger type or the reverse stagger type of course. Source and drain regions may also be formed by in situ doping, using the Si layer of the present invention, whereby the step of ion implantation can be simplified. In combination with the poly-Si electrode described above, the TFT can also be formed without the process of ion implantation at all, promising a high degree of freedom. These steps may also be carried out in the same chamber, whereby many processes can be performed without break of vacuum, and TFT with much better characteristics can be obtained.

Example 7

Example 7 is an example in which the TFT described in Example 6 is employed in a liquid-crystal display device.

Figure 9:
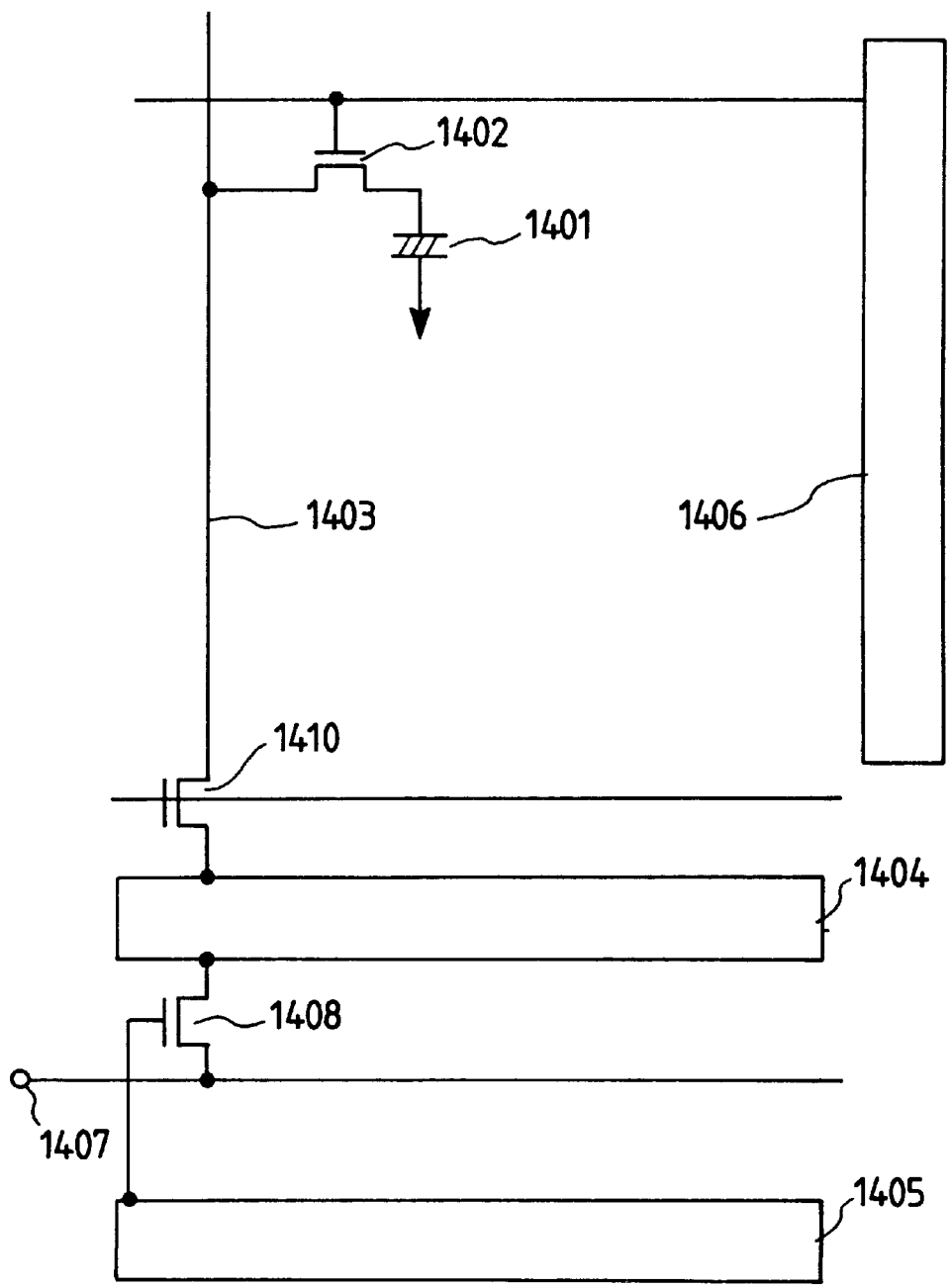
FIG. 9 illustrates an example of a liquid-crystal display.

FIG. 9 illustrates a drive circuit of an active matrix type liquid-crystal display device.

The drive circuit shown in FIG. 9 is constituted of a picture element area comprised of a liquid-crystal display cell 1401 having a liquid-crystal material sealed between a common electrode (potential: represented as $V_{COM}$) and each picture element electrode, an image signal wiring area (hereinafter "signal wiring") 1403, a line buffer area 1404, a shift pulse switch 1408, an output switch 1410, a horizontal shift register 1405, a gate signal wiring area (hereinafter "gate wiring") and a vertical shift register 1406.

Recording signals are transmitted, while displacing the timing, from a signal input terminal 1407 successively to each picture element or each line.

FIGS. 10A and 10B illustrate drive pulse timing of this conventional active matrix liquid-crystal display device. In these figures, a line sequential driving method is illustrated. More specifically, image signals to be recorded in the crystal liquid pass through the shift pulse switch 1408 which is driven by the horizontal shift register 1405 synchronized with the frequency of the image signals, and image signals for one line are recorded in the line buffer area 1404 (FIG. 10A). After image signals of all picture elements for a certain line have been recorded in the line buffer area 1404, the image signals are recorded in each liquid-crystal cell through the picture element switch turned on by operating the output switch 1410 of the line buffer area 1404 and the vertical shift register 1406. Usually the signals are transmitted to each liquid-crystal cell in bundle for a certain line during a blanking interval in the period of horizontal scanning. According to the timing as stated above, the image signals are successively transmitted to each line (FIG. 10B).

Liquid-crystal molecules constituting the cells act in response to the voltage of the signals thus transmitted to cause changes in transmission of the liquid-crystal cells in accordance with the direction of a polarizing plate separately provided in relation to a cross polarizer. This difference in transmission is represented as light and shade of each picture element, and thus the liquid-crystal cells operate as a display device.

In this switching transistor 1402, the TFT semiconductor device of the present invention was used.

Since the TFT having a drive power, causing less leak currents in the off state and also showing good rise characteristics can be readily formed by a low-temperature process, the active matrix type liquid-crystal display device shown in FIG. 9 was set up inexpensively good characteristics. The semiconductor device of the present invention may also be used in the horizontal shift register and the vertical shift register, and also other process, e.g., laser annealing may be used when a higher performance is required. No particular limitations are required.

Example 8

Example 8 is an example of a liquid-crystal display in which TFT is made from poly-Si and peripheral driving circuit is made from bulk-Si, and Example 8 shows the manufacturing method of the same.

Figure 11:
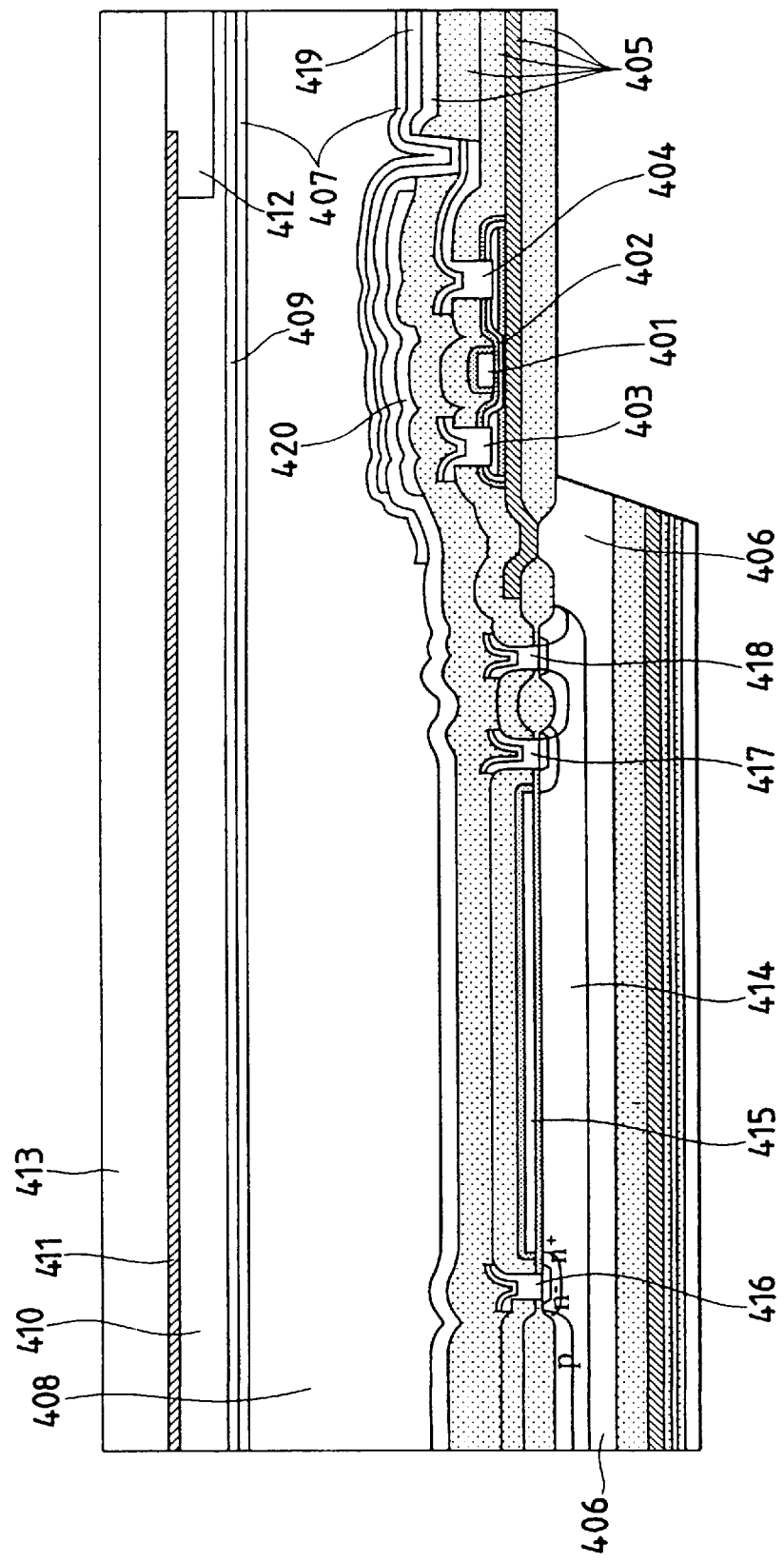
FIG. 11 is a schematic cross-sectional view of Example 8 of the present invention.

FIG. 11 illustrates the cross-sectional structure of an active matrix liquid-crystal display device and shows the features of Example 8.

In FIG. 11, reference numeral 401 denotes a gate electrode of a thin-film transistor. Reference numeral 402 denotes a semiconductor layer which is made of, for example, monocrystalline silicon, polycrystalline silicon or amorphous silicon to form a channel area of the thin-film transistor. Reference numeral 403 denotes a source electrode. Reference numeral 404 denotes a drain electrode. Reference numeral 405 denotes an interlayer insulator film. Reference numeral 406 denotes a monocrystalline silicon substrate. Reference numeral 407 denotes an orientation film. Reference numeral 408 denotes a liquid-crystal material. Reference numeral 409 denotes an opposed transparent electrode. Reference numeral 410 denotes an interlayer film. Reference numeral 411 denotes a light blocking layer. Reference numeral 412 denotes a color filter layer. In the case of a monochrome display panel, no color filter layer exists. Reference numeral 413 denotes an opposed transparent substrate. Reference numeral 414 denotes a semiconductor diffused layer formed in the monocrystalline silicon substrate to form a channel area of a transistor and having a conductivity type reverse from that of the monocrystalline silicon substrate.

Reference numeral 415 denotes a gate electrode which is formed in this embodiment by the same process as that in which the gate electrode 401 of the transistor is formed. However, the gate electrode 415 may be formed in another process. The gate electrode 415 and the channel area 414 oppose each other with an insulator layer therebetween. Reference numerals 416 and 417 are respectively source and drain-electrodes of a transistor which are formed in the monocrystalline substrate. Reference numeral 418 denotes an electrode of the semiconductor diffused area 414. Reference numeral 419 denotes a transparent pixel electrode connected to the drain electrode 404. Reference numeral 420 denotes a storage capacitor common electrode which forms a storage capacitor for holding electric charges of the pixel electrode portion. The common electrode 420 and the pixel electrode 419 in combination form a storage capacitor.

Figure 14A:
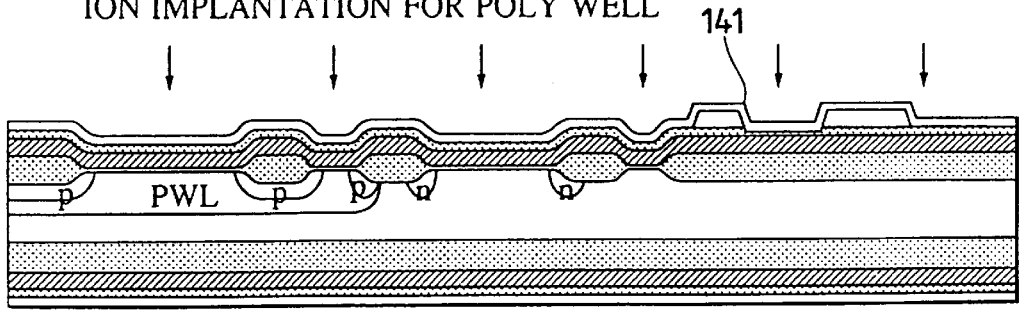
FIGS. 14A, 14B and 14C illustrate manufacturing steps of Example 8.
Figure 14B:
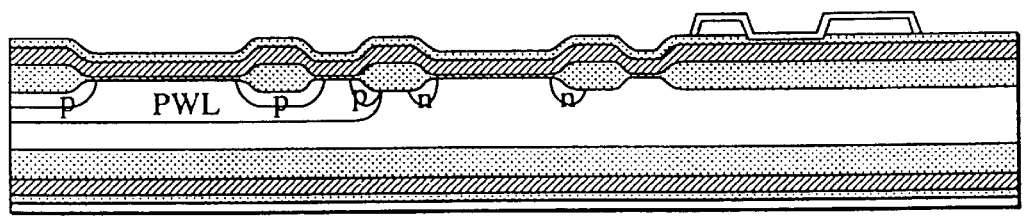
Figure 14C:
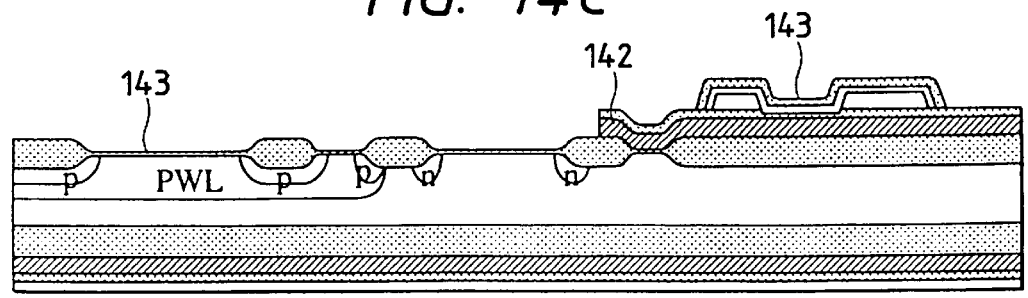

In Example 8, a dielectric formed between the gate electrode 415 of the monocrystalline transistor formed in the monocrystalline silicon substrate and an inverted layer of the channel area 414 thereof is used as a holding capacitor for a video signal. The dielectric is formed of silicon oxide. A video signal is held in the gate electrode 415 and recorded in the pixel electrode at a desired timing. The pixel area consists of the thin-film transistor formed on the interlayer insulator film 419 and the transparent pixel electrode 419 connected to the drain electrode of that thin-film transistor. The portion of the monocrystalline silicon substrate, located below the pixel area, is removed by etching, as shown in FIGS. 14A to 14C so that it can be seen through under visible light.

The holding capacitor is constituted using, as a dielectric layer, the insulator film formed on the monocrystalline substrate. The pixel area portion, which is constituted by the thin-film transistor on the interlayer insulator film and the transparent electrode, has a structure in which the portion of the silicon substrate layer located below the pixel area portion is removed by etching so that it can be seen through. It is thus possible to provide a transmission type liquid crystal display device having a highly reliable holding capacitor.

In Example 8, Si layer forming the channel area of the thin-film transistor is made by the method explained in Example 6. Therefore, off-leak current and light-leak current of this channel area are very small, and the thin-film transistor has very good quality. By using it the liquid-crystal display with very high resolution can be realized.

FIGS. 12A and 12B, FIGS. 13A to 13C, FIGS. 14A to 14C, FIGS. 15A and 15B, FIGS. 16A and 16B, FIG. 17A to 17C, FIGS. 18A and 18B, and FIG. 19 schematically illustrate the method of manufacturing the above-described structure.

Figure 12A:
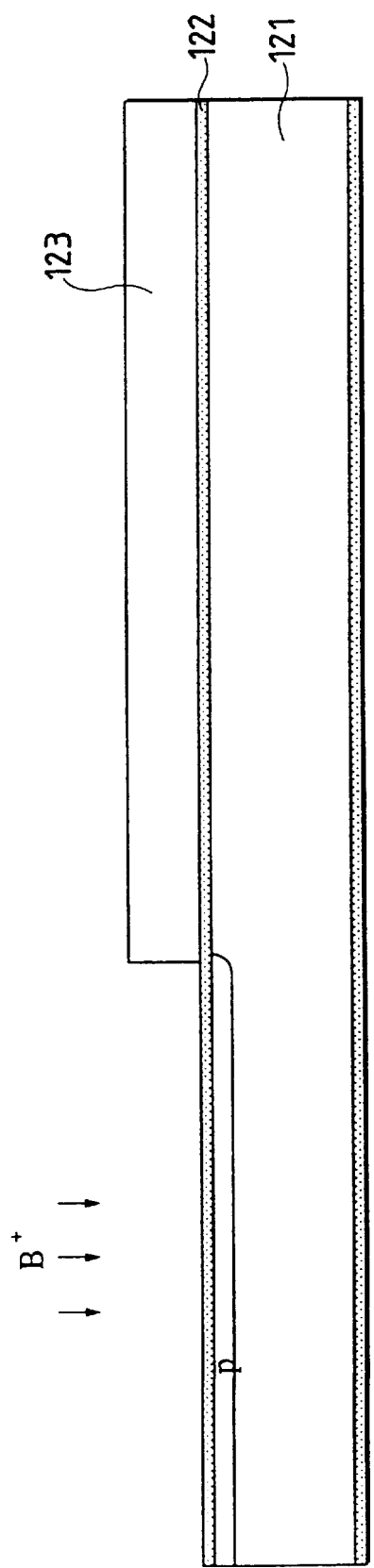
FIGS. 12A and 12B illustrate manufacturing steps of Example 8.
Figure 12B:
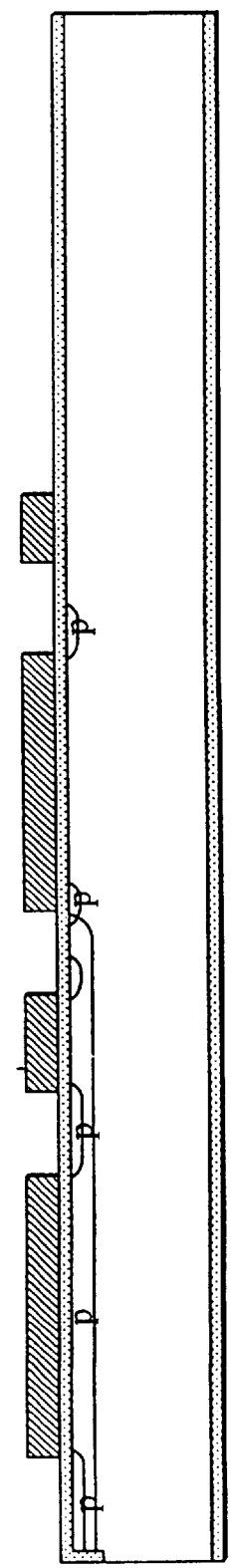

FIG. 12A illustrates a step in which a p type well is formed in an n type Si substrate 121. The p type well (PWL) is manufactured by masking an oxide film 122 having a thickness of 200Å formed on the substrate using a resist 123 and by implanting boron ions. FIG. 12B illustrates a step in which a resist used for LOCOS (localized oxidation of silicon) is pasted. After the surface is oxidized, SiN (an oxidized nitrided film) is deposited on the surface and patterned.

Figure 13A:
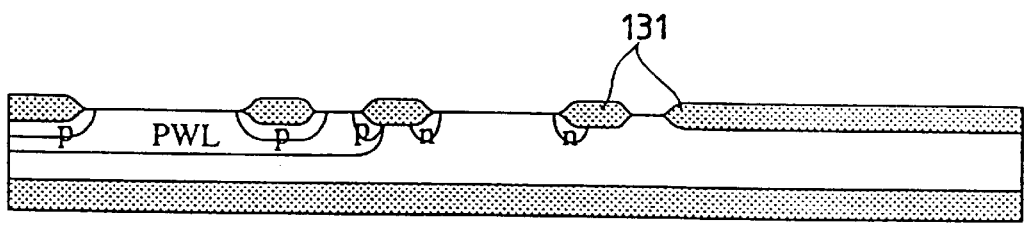
FIGS. 13A, 13B and 13C illustrate manufacturing steps of Example 8.
Figure 13B:
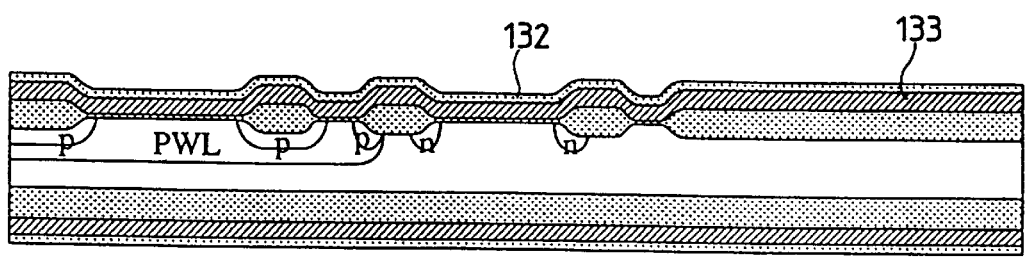
Figure 13C:
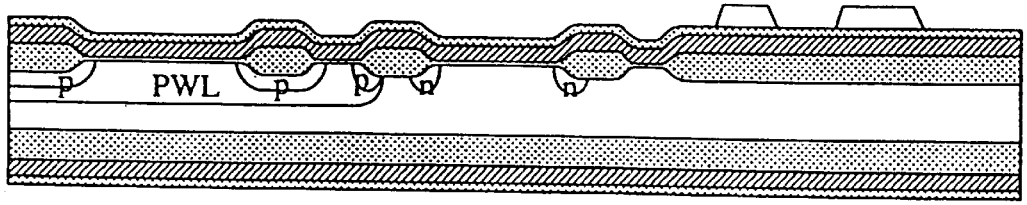

FIG. 13A illustrates a step in which LOCOS is formed. A field oxide film 131 having a thickness of 400 nm to 1500 nm is formed by conducting wet oxidation at a temperature ranging from 1000 to 1100° C. FIG. 13B illustrates a step in which SiN 133 is formed on the surface. A SiN film is deposited to a thickness of 50 rim to 100 nm by thermal CVD, and a buffer oxide film 132 is deposited on the SiN film. FIG. 13C to FIG. 14A illustrate steps in which polysilicon which forms pixel TFTs is formed on the surface. Polycrystalline Si is deposited to a thickness of 50 nm to 400 nm and patterned. Moreover, polycrystalline Si is deposited in a thickness of 20 nm to 200 nm. This polycrystalline Si is produced in the above Examples.

FIG. 14A illustrates a step in which p type ions are implanted to adjust the threshold value of the n type TFT. Reference numeral 141 denotes TFT poly-Si film. Ion implantation is conducted at a density of $10^{12}$ to $10^{14}$ $cm^{-3}$. FIG. 14B illustrates a step in which polycrystalline Si deposited on the portion other than the upper surface of TFT is removed. FIG. 14C illustrates a step in which a nitride film formed on the portion other than the upper surface of TFT is removed to expose the peripheral circuit alone.

Reference numeral 142 denotes SiN and reference numeral 143 denotes gate oxide film.

Figure 15A:
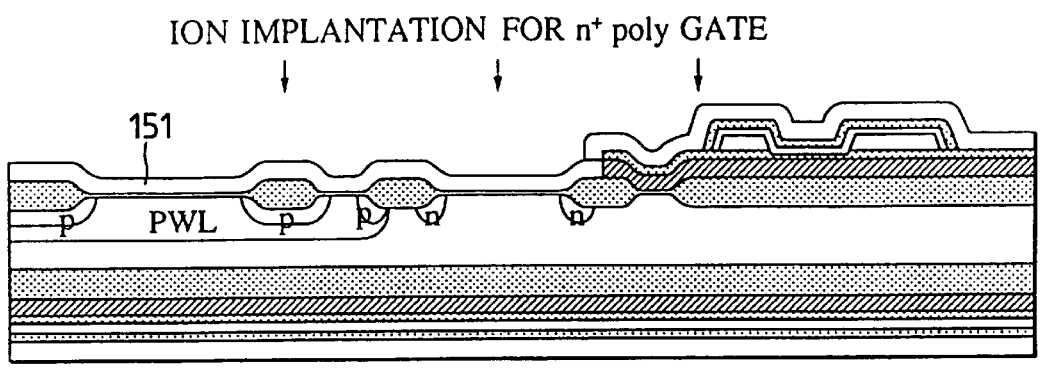
FIGS. 15A and 15B illustrate manufacturing steps of Example 8.
Figure 15B:
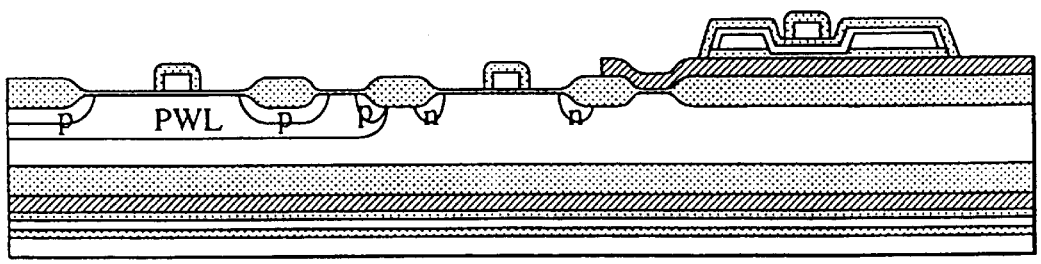

FIG. 15A illustrates a step in which polycrystalline Si for the gate electrode is formed. FIG. 15B illustrates a step in which the gate electrode is patterned. Reference numeral 151 denotes poly-Si for gate.

Figure 16A:
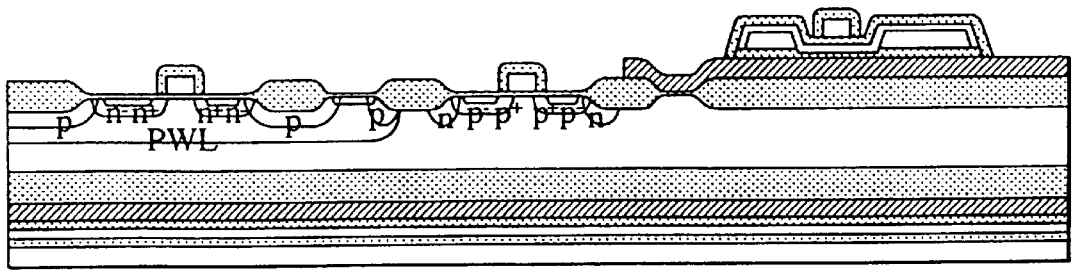
FIGS. 16A and 16B illustrate manufacturing steps of Example 8.
Figure 16B:
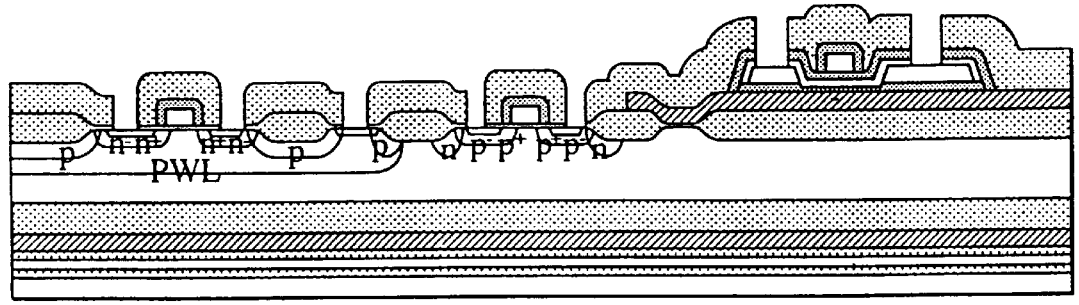

FIG. 16A illustrate a step in which ion implantation is conducted on the TFT and peripheral circuit portion to form the source area and drain area. FIG. 16B illustrates formation of the interlayer film.

Figure 17A:
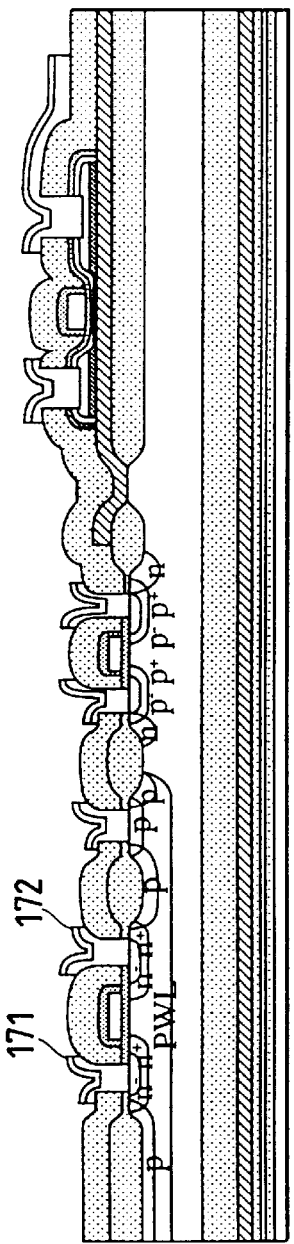
FIGS. 17A, 17B and 17C illustrate manufacturing steps of Example 8.
Figure 17B:
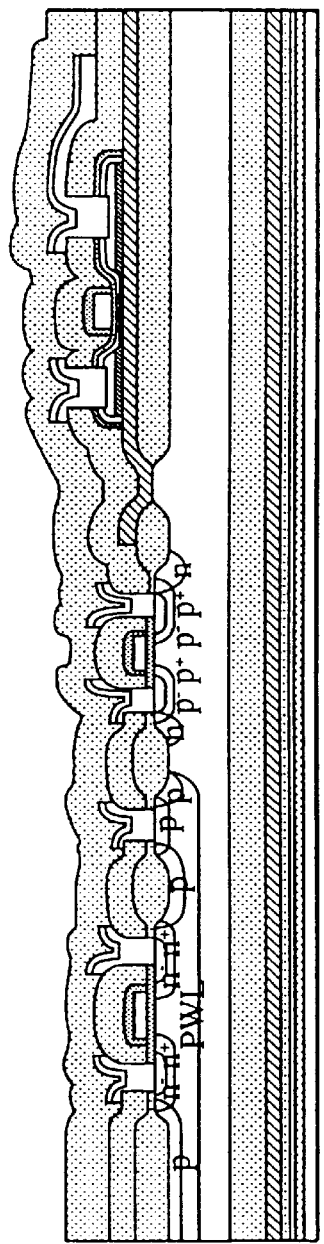
Figure 17C:
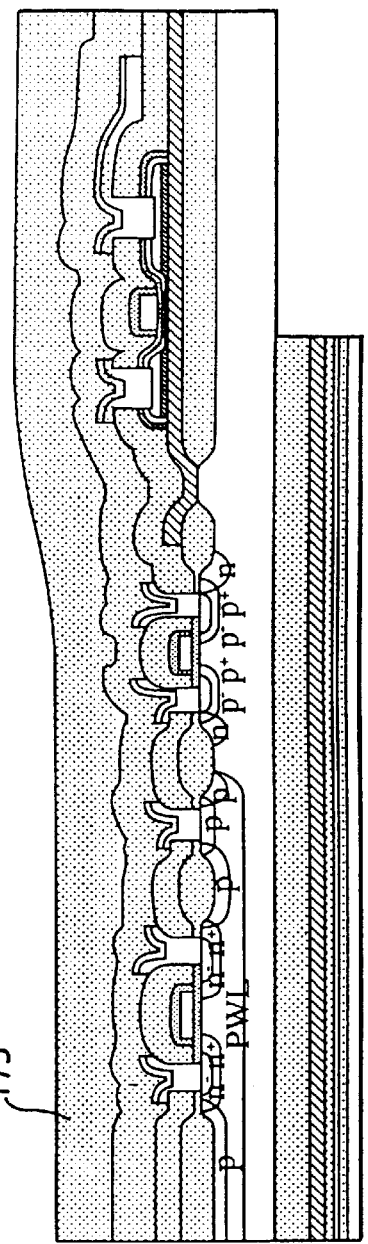

FIG. 17A illustrates a step in which Al—Si is deposited to form an extension electrode. Reference numeral 171 denotes TiN and reference numeral 172 denotes Al. FIG. 17B illustrates a step in which the interlayer insulator film is formed. FIG. 17C illustrates a step in which surface protecting resist 173 is coated.

Figure 18A:
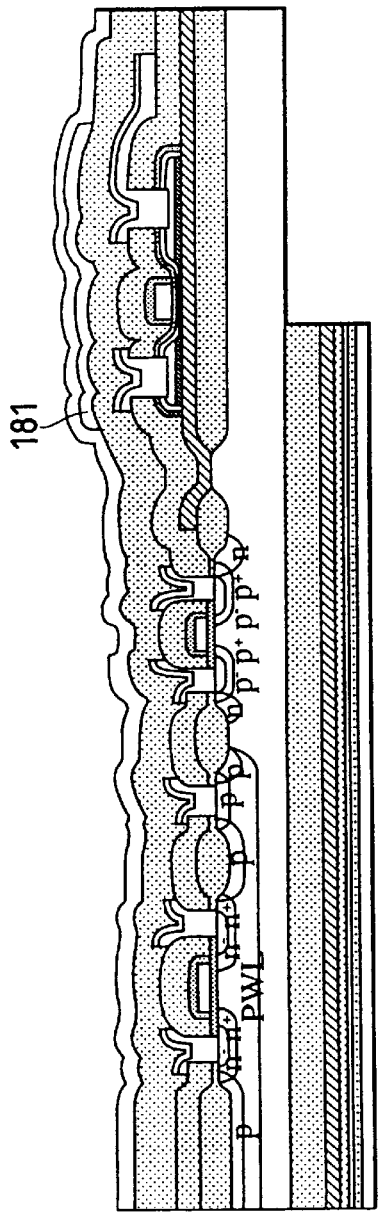
FIGS. 18A and 18B illustrate manufacturing steps of Example 8.
Figure 18B:
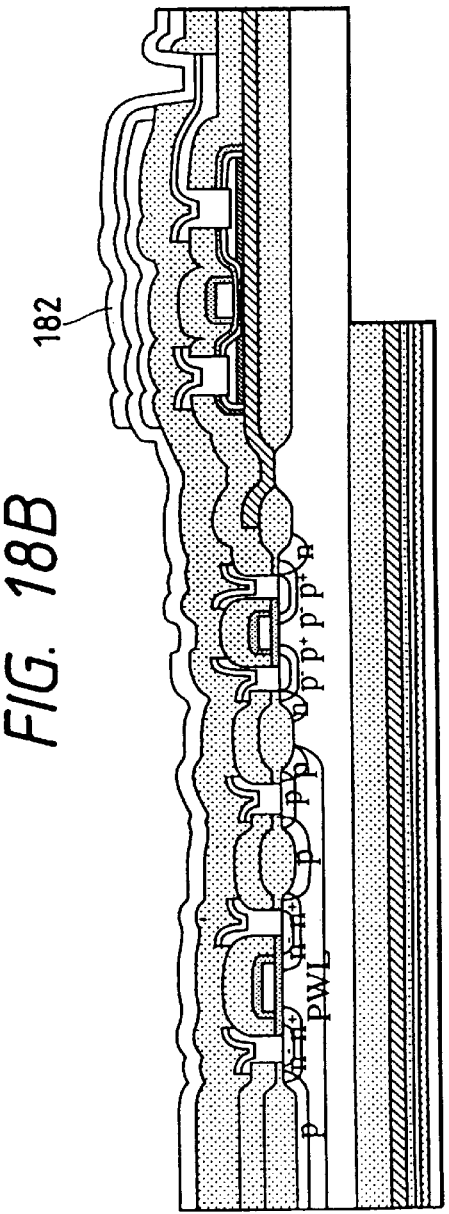

FIG. 18A illustrates a step in which TiN 181 for shielding the TFT from light is deposited on the upper surface of TFT. FIG. 18B illustrates a step in which the transparent pixel electrode is formed. Reference numeral 182 denotes ITO.

Figure 19:
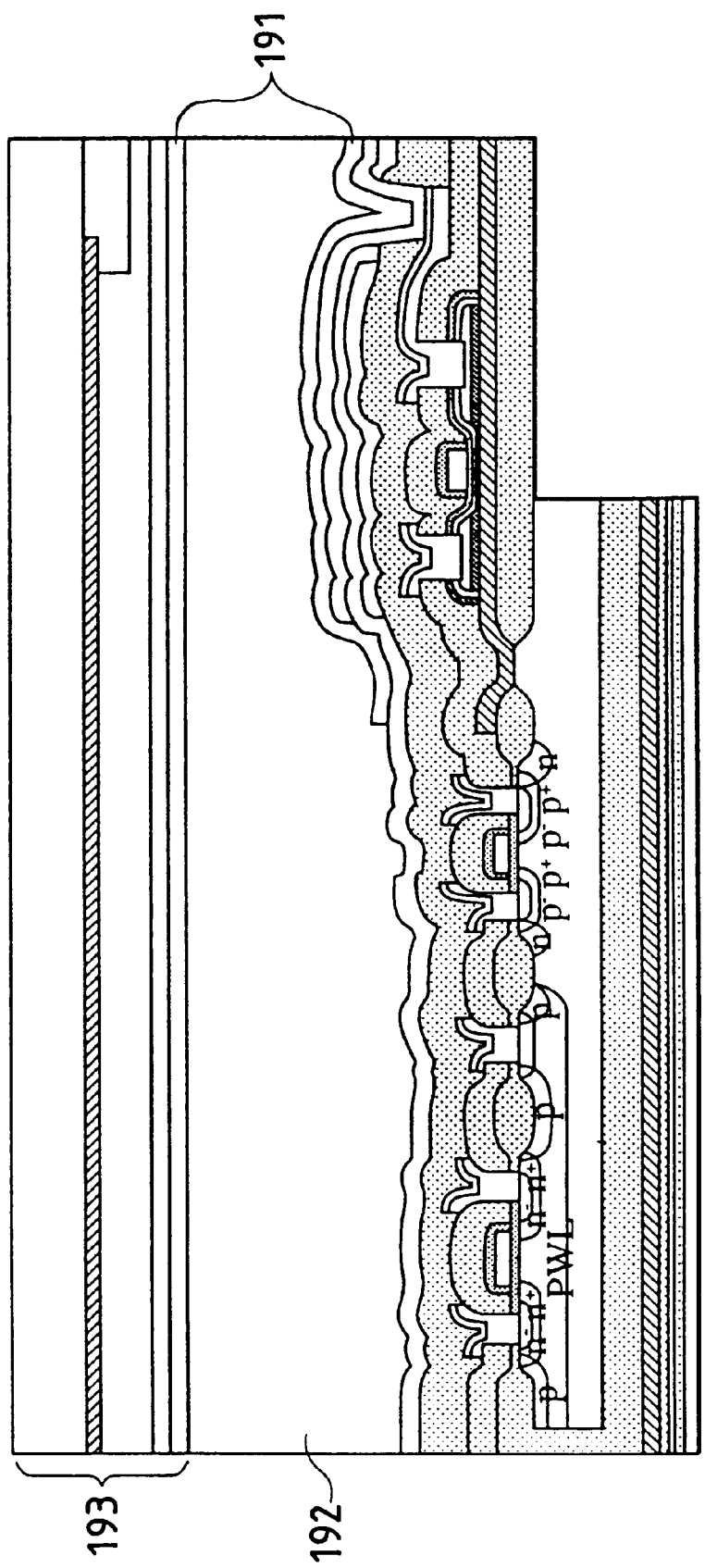
FIG. 19 illustrates manufacturing step of Example 8.

FIG. 19 is a cross-sectional view of a liquid-crystal display device completed by combining the thus-obtained substrate with an opposed substrate having the common electrode. Reference numeral 191 denotes orientation film; 192, liquid-crystal; and 193, filter substrate.

In the above examples, we have shown the transparent liquid-crystal display. However, if the transparent electrode is replaced with the metal electrode and the Si substrate is not etched, it can be the reflective liquid-crystal display.

What is claimed is:

1. A semiconductor substrate comprising an Si layer having a carbon content, a hydrogen content and a rare gas (X) content of $C \leq 1 \times 10^{18}$ $cm^{-3}$, $1 \times 10^{15}$ $cm^{-3} \leq H \leq 1 \times 10^{20}$ $cm^{-3}$ and $1 \times 10^{16}$ $cm^{-3} \leq X$, respectively, and having a difference of 15 nm or less between a maximum value and a minimum value of surface roughness.

2. The semiconductor substrate according to claim 1, wherein said Si layer is monocrystalline, and $C \leq 5 \times 10^{17}$ $cm^{-3}$, $1 \times 10^{16}$ $cm^{-3} \leq H \leq 1 \times 10^{19}$ $cm^{-3}$ and $1 \times 10^{16}$ $cm^{-3} \leq X \leq 1 \times 10^{18}$ $cm^{-3}$.

3. The semiconductor substrate according to claim 1, wherein said Si layer is polycrystalline, and $C \leq 5 \times 10^{17}$ $cm^{-3}$, $1 \times 10^{17}$ $cm^{-3} \leq H \leq 1 \times 10^{19}$ $cm^{-3}$ and $1 \times 10^{16}$ $cm^{-3} \leq X \leq 1 \times 10^{19}$ $cm^{-3}$.

4. The semiconductor substrate according to claim 1, wherein said Si layer is amorphous, and $C \leq 5 \times 10^{17}$ $cm^{-3}$, $1 \times 10^{17}$ $cm^{-3} \leq H \leq 1 \times 10^{20}$ $cm^{-3}$ and $1 \times 10^{17}$ $cm^{-3} \leq X \leq 1 \times 10^{20}$ $cm^{-3}$.

5. The semiconductor device according to claim 1, wherein said Si layer is amorphous, and $C \leq 5 \times 10$ $cm^{3}$, $1 \times 10^{17}$ $cm^{-3} \leq H \leq 1 \times 10^{20}$ $cm^{-3}$ and $1 \times 10^{17}$ $cm^{3} \leq X \leq 1 \times 10^{20}$ $cm^{-3}$.

6. A semiconductor device comprising an Si semiconductor layer having a carbon content, a hydrogen content and a rare gas (X) content of $C \leq 1 \times 10^{18}$ $cm^{-3}$, $1 \times 10^{15}$ $cm^{-3} \leq H \leq 1 \times 10^{20}$ $cm^{-3}$ and $1 \times 10^{16}$ $cm^{-3} \leq X$, respectively, and having a difference of 15 nm or less between a maximum value and a minimum value of surface roughness.

7. The semiconductor device according to claim 6, wherein said Si layer is monocrystalline, an $c \leq 5 \times 10^{17}$ $cm^{-3}$, $1 \times 10^{16}$ $cm^{-3} \leq H \leq 1 \times 10^{19}$ $cm^{-3}$ and $1 \times 10^{16}$ $cm^{-3} \leq X \leq 1 \times 10^{18}$ $cm^{-3}$.

8. The semiconductor device according to claim 6, wherein said Si layer is polycrystalline, and $C \leq 5 \times 10^{17}$ $cm^{-3}$, $1 \times 10^{17}$ $cm^{-3} \leq H \leq 1 \times 10^{19}$ $cm^{-3}$ and $1 \times 10^{16}$ $cm^{-3} \leq X \leq 1 \times 10^{19}$ $cm^{-3}$.

9. An active matrix type liquid-crystal display device comprising a picture element whose switching transistor comprises an Si layer having a carbon content, a hydrogen content and a rare gas (X) content of $C \leq 1 \times 10^{18}$ $cm^{-3}$, $1 \times 10^{15}$ $cm^{-3} \leq H \leq 1 \times 10^{20}$ $cm^{-3}$ and $1 \times 10^{16}$ $cm^{-3}$ $cm^{-3} \leq X$, respectively, and having a difference of 15 nm or less between a maximum value and a minimum value of surface roughness.

10. The liquid-crystal display device according to claim 9, wherein said Si layer is monocrystalline, and $C \leq 5 \times 10^{17}$ $cm^{-3}$, $1 \times 10^{16}$ $cm^{-3} \leq H \leq 1 \times 10^{19}$ $cm^{-3}$ and $1 \times 10^{16}$ $cm^{-3} \leq X \leq 1 \times 10^{18}$ $cm^{-3}$.

11. The liquid-crystal display device according to claim 9, wherein said Si layer is polycrystalline, and $C \leq 5 \times 10^{17}$ $cm^{-3}$, $1 \times 10^{17}$ $cm^{-3} \leq H \leq 1 \times 10^{19}$ $cm^{-3}$ and $1 \times 10^{16}$ $cm^{-3} \leq X \leq 1 \times 10^{19}$ $cm^{-3}$.

12. The liquid-crystal display device according to claim 9, wherein said Si layer is amorphous, and $C \leq 5 \times 10^{17}$ $cm^{-3}$, $1 \times 10^{17}$ $cm^{-3} \leq H \leq 1 \times 10^{20}$ $cm^{-3}$ and $1 \times 10^{17}$ $cm^{-3} \leq X \leq 1 \times 10^{20}$ $cm^{-3}$.

* * * * *

UNITED STATES PATENT AND TRADEMARK OFFICE
CERTIFICATE OF CORRECTION

PATENT NO.    : 6,057,557
DATED         : May 2, 2000
INVENTOR(S)   : TAKESHI ICHIKAWA

It is certified that error appears in the above-identified patent and that said Letters Patent is hereby corrected as shown below:

ON THE TITLE PAGE:

[54] Title,

"SUBSTRATE" should read --SUBSTRATE,--

COLUMN 1:

Line 1, "SUBSTRATE" should read --SUBSTRATE,--;
    Lines 10-12, lines 10-12 should be deleted;
    Line 37, "greatly since they" should read
        --since they greatly--; and
    Line 38, "encing" should read --ence--.

COLUMN 2:

Line 5, "a" should read --an--;
    Line 33, "however," should read --however, has--; and
    Line 62, "array" should be deleted.

COLUMN 3:

Line 8, "pm" should read --$\mu$m--; and
    Line 21, "to" should be deleted.

COLUMN 7:

Line 55, "lessen" should read --lessens--.

UNITED STATES PATENT AND TRADEMARK OFFICE
CERTIFICATE OF CORRECTION

PATENT NO. : 6,057,557
DATED : May 2, 2000
INVENTOR(S) : TAKESHI ICHIKAWA

It is certified that error appears in the above-identified patent and that said Letters Patent is hereby corrected as shown below:

COLUMN 8:

Line 15, "to" should be deleted.

COLUMN 9:

Line 2, "may" should be deleted;
    Line 17, "that of" should be deleted;
    Line 56, "O2 gas" should read --$O_2$ gas--; and
    Line 67, "plannar" should read --planar--.

COLUMN 12:

Table 2, "A  $9.7 \times 10^{-16}$" should read --A  $9.7 \times 10^{16}$--;
    Line 38, "a" should be deleted; and
    "cause" should read --caused--;
    Line 42, "remain" should read --remains--; and
    Line 51, "increases" should read --increases when--.

COLUMN 13:

Line 4, "n-type" should read --$n^-$-type--.

COLUMN 14:

Line 11, "was" should read --were--; and
    Line 65, "of" should be deleted.

COLUMN 15:

UNITED STATES PATENT AND TRADEMARK OFFICE
CERTIFICATE OF CORRECTION

PATENT NO.    : 6,057,557
DATED         : May 2, 2000
INVENTOR(S)   : TAKESHI ICHIKAWA

It is certified that error appears in the above-identified patent and that said Letters Patent is hereby corrected as shown below:

Line 25, "200w" should read --200W--.

COLUMN 17:

Line 2, "$O_2$ gas:" should read --$O_2$ gas=--.

COLUMN 21:

Line 18, "50 rim" should read --50 nm--;
    Line 35, Close up left margin; and
    Line 42, "illustrate" should read --illustrates--.

UNITED STATES PATENT AND TRADEMARK OFFICE
CERTIFICATE OF CORRECTION

PATENT NO.    : 6,057,557
DATED         : May 2, 2000
INVENTOR(S)   : TAKESHI ICHIKAWA

It is certified that error appears in the above-identified patent and that said Letters Patent is hereby corrected as shown below:

COLUMN 22:

Line 24, "$C \leq 5 \times 10$ cm$^3$," should read --$C \leq 5 \times 10^{17}$ cm$^{-3}$,--;
Line 25, "$1 \times 10^{17}$ cm$^3$" should read --$1 \times 10^{17}$ cm$^{-3}$--;
Line 35, "an $c \leq 5 \times 10^{17}$" should read --and $C \leq 5 \times 10^{17}$--; and
Line 46, "cm$^{-3}$" (fourth occurrence) should be deleted.

Signed and Sealed this

Twenty-ninth Day of May, 2001

Attest:

NICHOLAS P. GODICI

Attesting Officer    Acting Director of the United States Patent and Trademark Office